United States Patent [19]
Hemink et al.

[11] Patent Number: 5,870,334
[45] Date of Patent: Feb. 9, 1999

[54] NONVOLATILE SEMICONDUCTOR MEMORY DEVICE

[75] Inventors: Gertjan Hemink, Kawasaki; Tomoharu Tanaka, Yokohama, both of Japan

[73] Assignee: Kabushiki Kaisha Toshiba, Kawasaki, Japan

[21] Appl. No.: 873,015

[22] Filed: Jun. 11, 1997

Related U.S. Application Data

[63] Continuation of Ser. No. 527,725, Sep. 13, 1995, abandoned.

[30] Foreign Application Priority Data

Sep. 17, 1994 [JP] Japan ................................. 6-248452

[51] Int. Cl.$^6$ ...................................................... G11C 16/04
[52] U.S. Cl. ................................ 365/185.17; 365/185.19; 365/185.24; 365/185.29; 365/218
[58] Field of Search .................... 365/185.17, 185.19, 365/185.24, 185.29, 218

[56] References Cited

U.S. PATENT DOCUMENTS 5,278,794  1/1994  Tanaka et al. .................. 365/185.17
5,652,719  7/1997  Tanaka et al. .................. 365/185.17

*Primary Examiner*—David Nelms
*Assistant Examiner*—Trong Phan
*Attorney, Agent, or Firm*—Oblon, Spivak, McClelland, Maier & Neustadt, P.C.

[57] ABSTRACT

In a nonvolatile semiconductor memory device including a memory cell array obtained by arranging, in a matrix manner, electrically programmable memory cells, each of which comprises stacking a charge storage layer and a control gate on a semiconductor layer through an insulating film, the threshold voltages of the memory cells are detected after erasing, and data are programmed in a fast programmable cell at a relatively low voltage and in a slow programmable cell at a relatively high voltage, thereby suppressing variations in threshold voltages after programming within the same period of programming time.

42 Claims, 12 Drawing Sheets

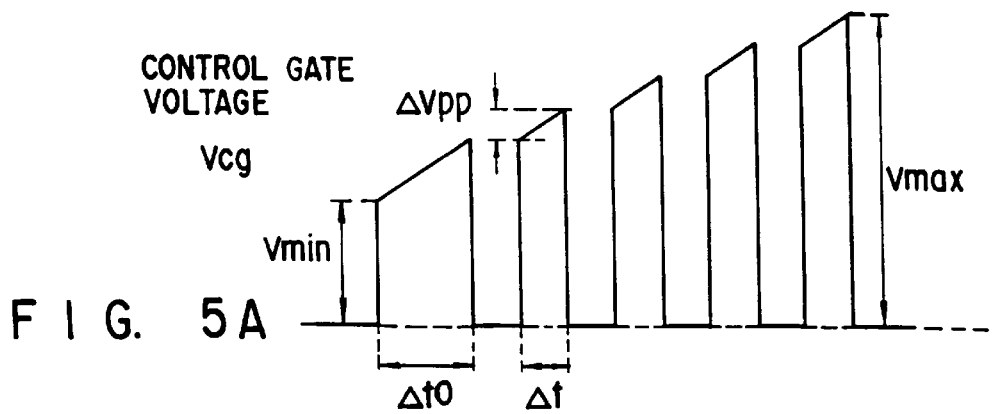
F I G. 5A
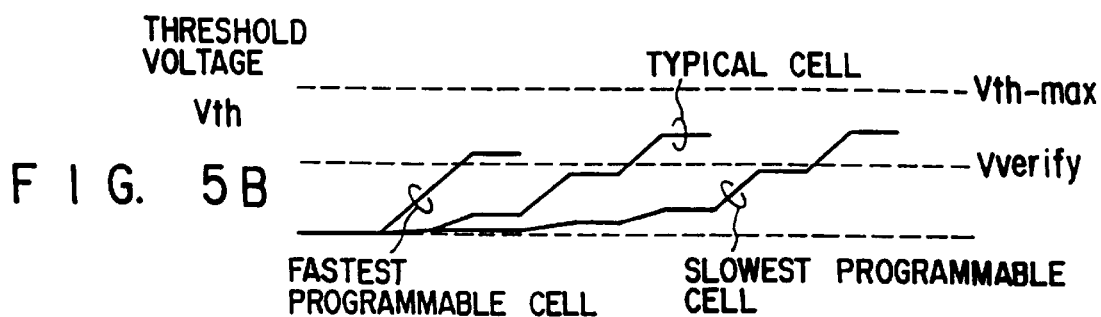
F I G. 5B
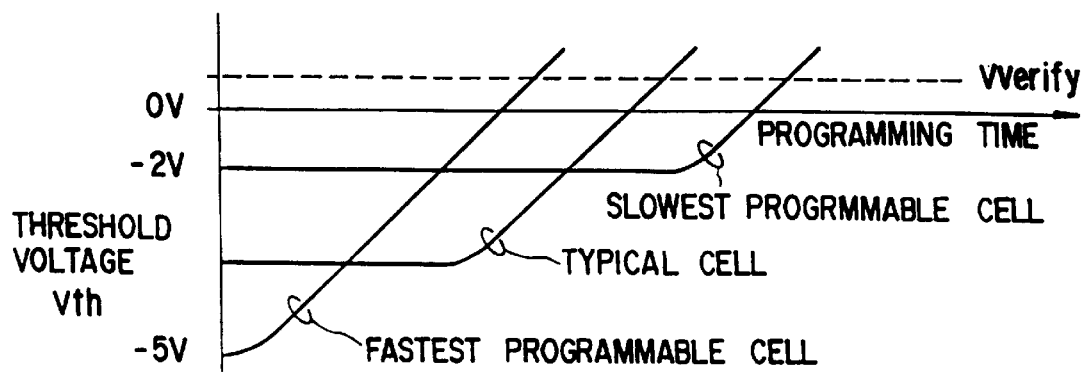
F I G. 6
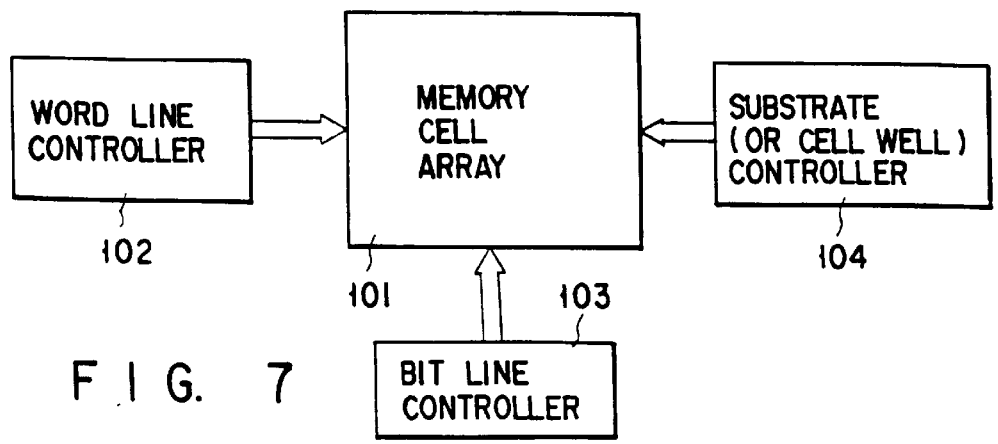
F I G. 7

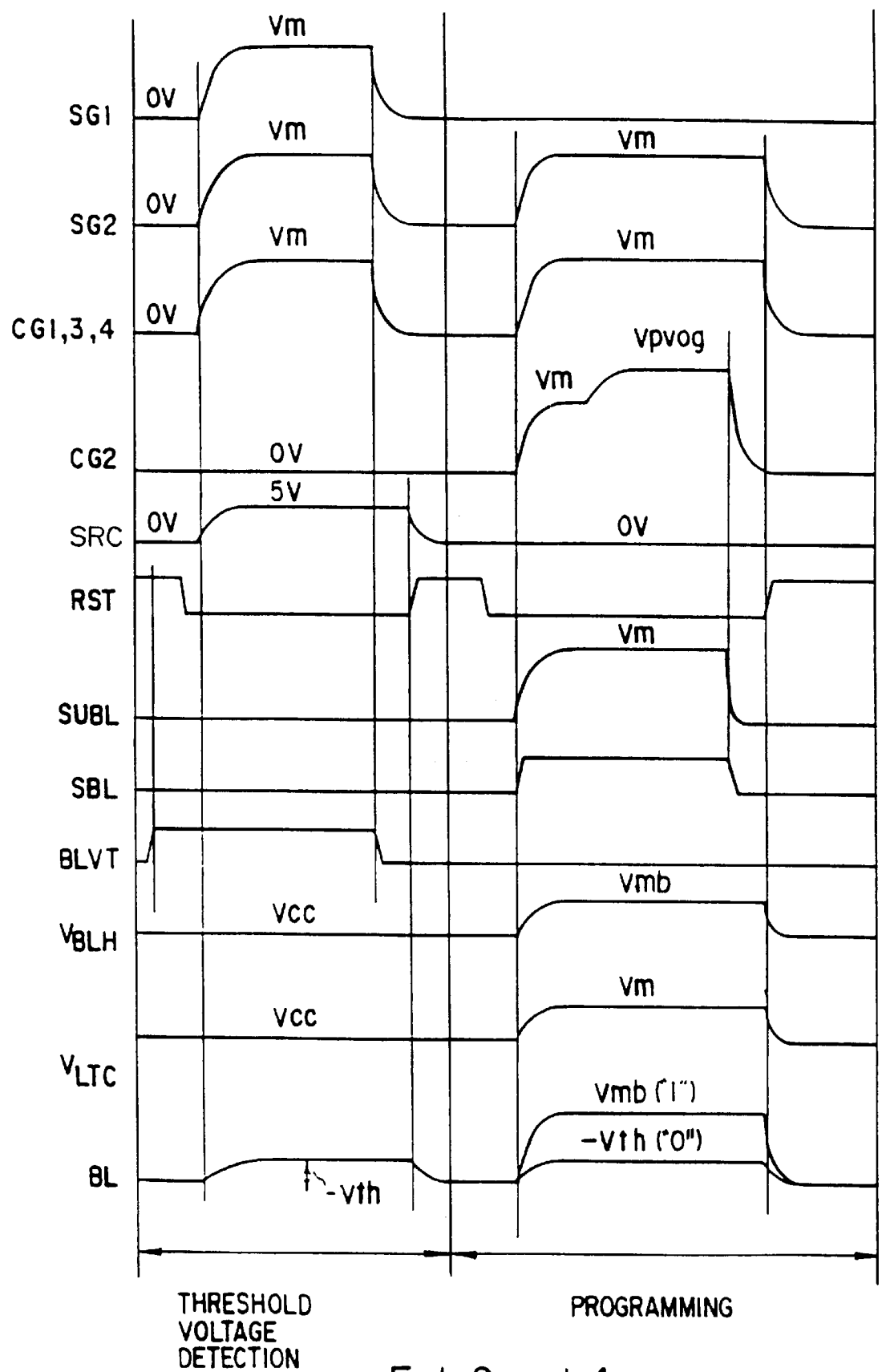
F I G. 14

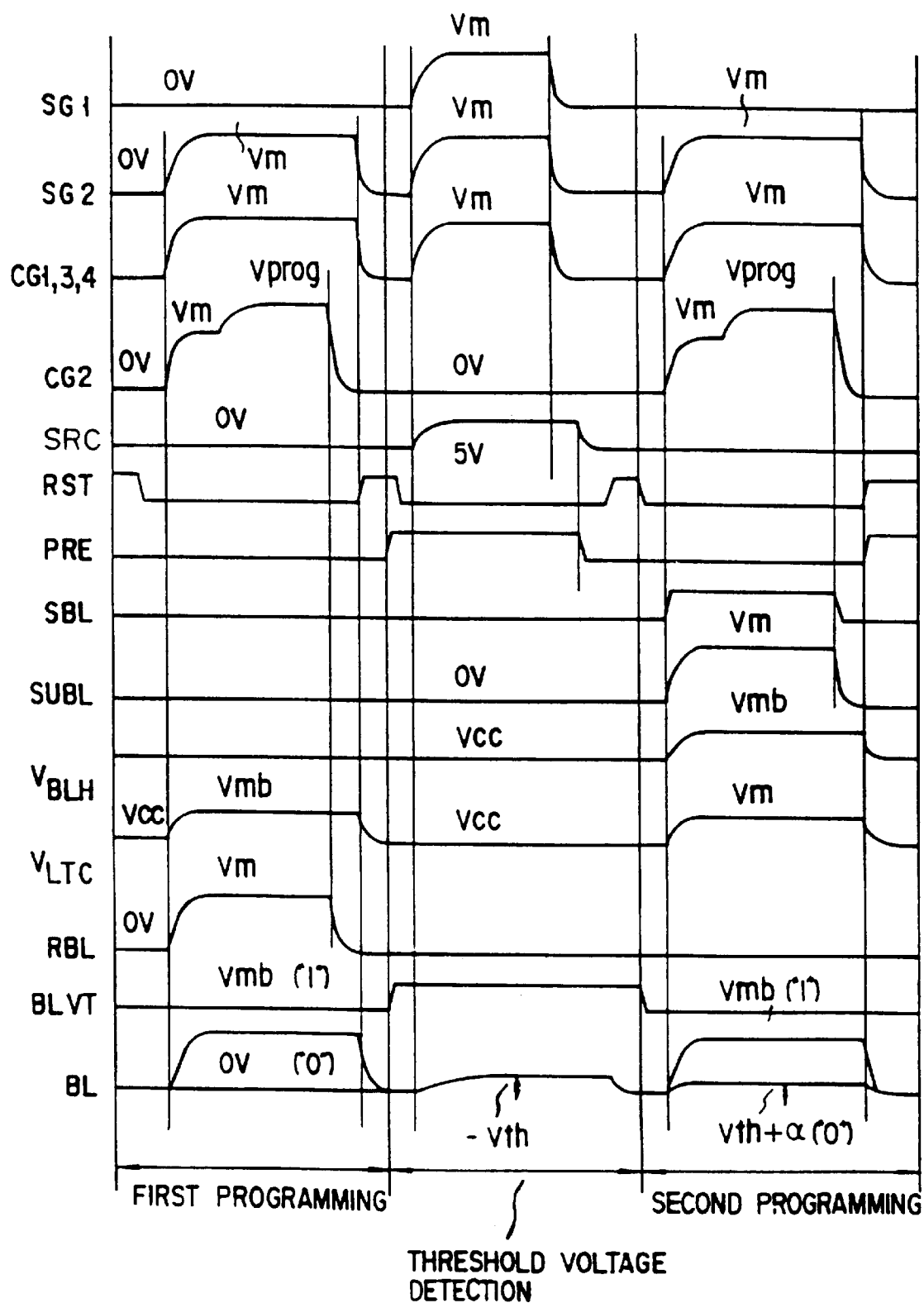
F I G. 17

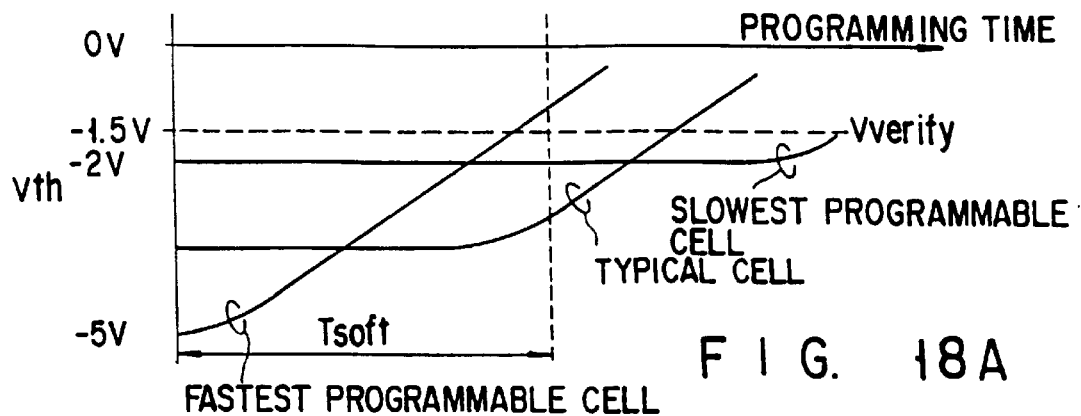
FIG. 18A
FIG. 18B
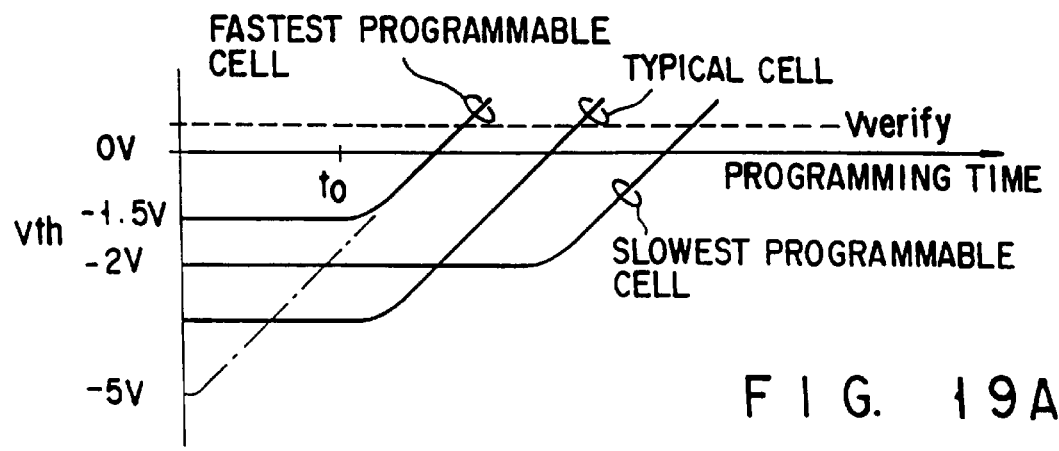
FIG. 19A
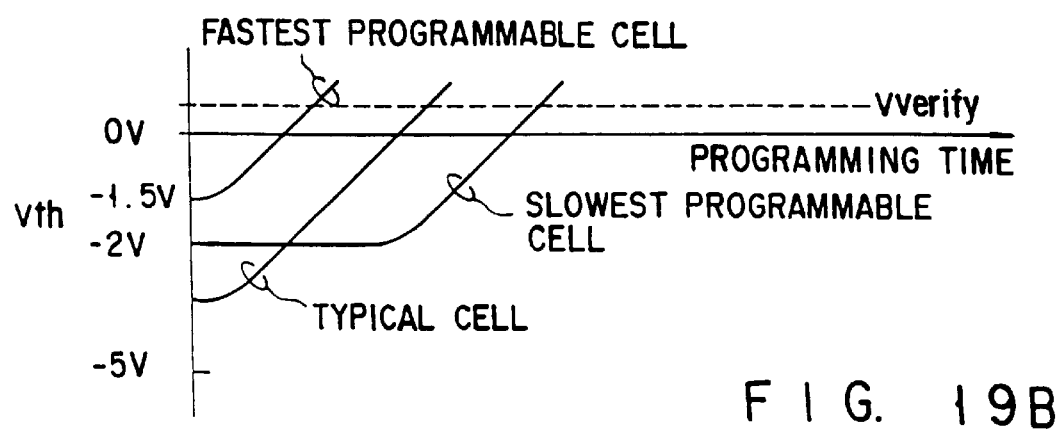
FIG. 19B

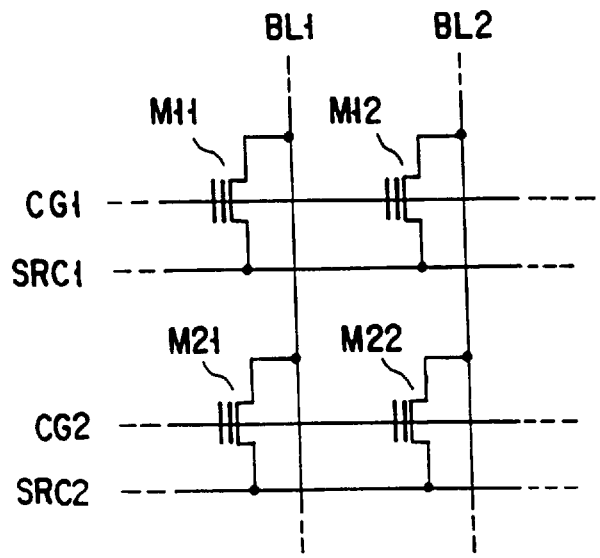
F I G. 20
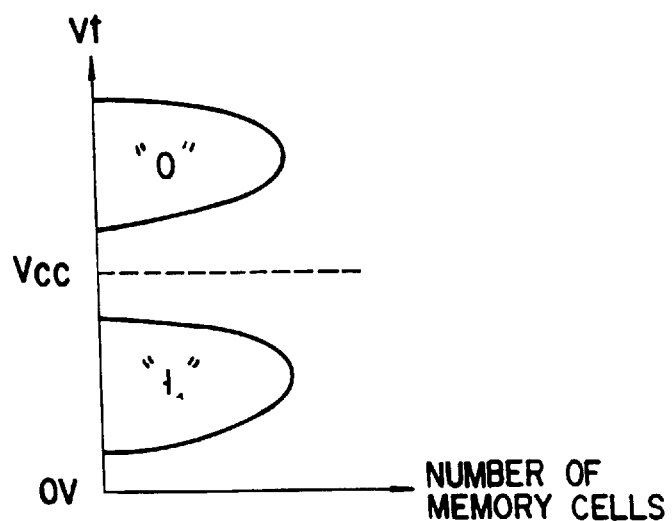
F I G. 21

NONVOLATILE SEMICONDUCTOR MEMORY DEVICE

This application is a continuation of application Ser. No. 527,725 filed Sep. 13, 1995 now abandoned.

BACKGROUND OF THE INVENTION

1. Field of the Invention

The present invention relates to a nonvolatile semiconductor memory device such as an electrically erasable and programmable ROM (EEPROM).

2. Description of the Related Art

As one of nonvolatile semiconductor memory devices, a NAND-cell type EEPROM capable of high integration is known. In this NAND-cell type EEPROM, a predetermined number of memory cells are connected in series with adjacent memory cells by sharing their sources and drains, and each group of in series-connected memory cells is connected to a bit line as one unit (NAND cell section). A general memory cell has a FETMOS structure in which a floating gate (charge storage layer) and a control gate are stacked. Memory cell arrays are integrated and formed in a P-type substrate or a P-type well region formed on an N-type substrate. The drain side of the NAND cell section is connected to the bit line through a first selection gate, and the source side is connected to a common source line through a second selection gate. The control gates of the memory cells are continuously arranged in a row direction to serve as word lines.

The operation of this NAND-cell type EEPROM is as follows.

Data programming is started from a memory cell at the furthest position viewing from the bit line. A high voltage Vpp (=about 20 V) is applied to the control gate of a selected memory cell, an intermediate voltage Vm (=about 10 V) is applied to the selection gate and the control gate of memory cells closer to the bit line than the selected memory cell, and 0 V or an intermediate voltage Vmb (=about 8 V) is applied to the bit line in accordance with data to be programmed.

When 0 V is applied to the bit line, the potential of the bit line is transferred to the drain of the selected memory cell, and electrons are injected into a floating gate to shift the threshold voltage of the selected memory cell in the positive direction. This state is defined as, e.g., "0".

When the intermediate voltage Vmb is applied to the bit line, no effective electron injection occurs. Therefore, the threshold voltage does not change and remains negative. This state is defined as "1" or the erased state.

Data are simultaneously programmed in memory cells sharing a control gate. A programming voltage Vpp is gradually increased to increase the programming speed while assuring the reliability of the memory cells. This is because abrupt application of a high voltage may destruct the tunnel portion of the memory cell.

Data are simultaneously erased from all memory cells in a NAND cell section. That is, all control gates are set to 0 V, and the P-type substrate or P-type well region is set to 20 V. At this time, a selection gate, a bit line, and a source line are also set to 20 V. With this operation, electrons of the floating gates in all the memory cells are discharged to the P-type substrate or P-type well region to shift the threshold voltages in the negative direction.

Data reading is performed by detecting whether a current flows in a selected memory cell while the control gate of the selected memory cell is set to 0 V, and the control gates and selection gates of remaining memory cells are set to a power supply voltage Vcc (e.g., 5 V).

Due to limitations in reading, a threshold voltage after "0" programming must be controlled to fall within the range of 0 V to the power supply voltage Vcc. For this reason, programming verification is performed to detect the memory cells in which "0" programming is insufficient and to set the reprogramming data such that the data is reprogrammed in the insufficient "0" programming memory cells (bit-by-bit verification). An insufficient "0" programming memory cell is detected by reading out (verify-read) the data at a selected control gate voltage of, e.g., 0.5 V (verification voltage). That is, if the threshold voltage of a memory cell is not 0.5 V (0 V+margin) or more, a current flows through a selected memory cell, and an insufficient "0" programming state is detected.

By performing data programming by repeating programming and programming verification, the programming time is optimized for each memory cell to properly control the threshold voltage after "0" programming to fall within the range of 0 V to Vcc. Since the programming voltage is increased in every programming step, programming is performed at high speed while assuring reliability.

In a NAND-cell type EEPROM of this type, the following problems are posed.

More specifically, the initial value of the programming voltage Vpp in programming must be set to be sufficiently low for a fast programmable memory cell while the final voltage must be set to be sufficiently high for a slow programmable memory cell. For this reason, when the increase rate of the programming voltage per unit of time is made constant, programming takes more time with a larger variation in the programming characteristics.

As this variation in programming characteristics becomes larger, programming and programming verification must be inevitably repeated a larger number of times, thereby prolonging the programming time.

Note that this problem is not limited to the NAND-cell type EEPROM and may be posed in another nonvolatile semiconductor memory device for performing programming/erasing data in/from a memory cell, e.g., a NOR cell type EEPROM.

As described above, in the conventional semiconductor memory device, if the variation in the programming characteristics of the memory cells is increased, the difference between the initial voltage and the final voltage of the programming voltage is increased, or the number of times of programming and programming verification is increased, thereby prolonging the programming time.

SUMMARY OF THE INVENTION

Accordingly, it is an object of the present invention to provide a nonvolatile semiconductor memory device capable of shortening the programming time by suppressing an increase in the difference between the initial voltage and the final voltage of the programming voltage and an increase in the number of times of programming and programming verification, which are caused by a variation in the programming characteristics of the memory cells.

A nonvolatile semiconductor memory device according to the present invention comprises a plurality of electrically programmable memory cells each having a charge storage portion; means for detecting the programmability of a predetermined memory cell of the plurality of memory cells; and programming means for applying a programming pulse to the predetermined memory cell in accordance with the programmability detected by the detecting means.

Another nonvolatile semiconductor memory device according to the present invention comprises a plurality of electrically programmable memory cells each having a charge storage portion; means for detecting the programmability of at least two predetermined memory cells of the plurality of memory cells; and programming means for applying programming pulses to the at least two predetermined memory cells in accordance with the programmability of the at least two predetermined memory cells detected by the detecting means so as to compensate a variation in programmability of the at least two predetermined memory cells and perform identical programming.

A further nonvolatile semiconductor memory device according to the present invention comprises a plurality of electrically programmable memory cells each having a charge storage portion; means for detecting the erasability of a predetermined memory cell of the plurality of memory cells; and programming means for applying an erasing pulse to the predetermined memory cell in accordance with the erasability detected by the detecting means.

Still another nonvolatile semiconductor memory device according to the present invention comprises a plurality of electrically programmable memory cells each having a charge storage portion; means for detecting the erasability of at least two predetermined memory cells of the plurality of memory cells; and erasing means for applying erasing pulses to the at least two predetermined memory cells in accordance with the erasability of the at least two predetermined memory cells detected by the detecting means so as to compensate a variation in erasability of the at least two predetermined memory cells and perform identical erasing.

Another nonvolatile semiconductor memory device according to the present invention comprises a plurality of electrically programmable memory cells each having a charge storage portion; erasing means for applying an erasing pulse to a predetermined memory cell of the plurality of memory cells; pre-programming means for applying a pre-programming pulse having a polarity reverse to the polarity of the erasing pulse to the predetermined memory cell in an erased state; verification means for detecting the state of the predetermined memory cell to which the pre-programming pulse has been applied; and programming means for applying a programming pulse having the same polarity as the polarity of the pre-programming pulse to the predetermined memory cell, whereby the pre-programming means applies the pre-programming pulse to the predetermined memory cell until the verification means detects a predetermined state of the memory cell after pre-programming by the pre-programming means.

Another nonvolatile semiconductor memory device according to the present invention comprises a plurality of electrically programmable memory cells each having a charge storage portion; programming means for applying a programming pulse to a predetermined memory cell of the plurality of memory cells; pre-erasing means for applying a pre-erasing pulse having a polarity reverse to a polarity of the programming pulse to the predetermined memory cell in a programmed state; verification means for detecting the state of the predetermined memory cell to which the pre-erasing pulse has been applied; and erasing means for applying an erasing pulse having the same polarity as the polarity of the pre-erasing pulse to the predetermined memory cell, whereby the pre-erasing means applies the pre-erasing pulse until the verification means detects a predetermined state of the memory cell after pre-erasing by the pre-erasing means.

According to the present invention, the threshold voltages of the memory cells are detected prior to the programming, and data are programmed in a fast programmable memory cell at a relatively low programming voltage and in a slow programmable memory cell at a relatively high programming voltage, thereby suppressing the variation in the programming characteristics. Therefore, bit-by-bit verification can be omitted, or the repetition numbers of times of programming and bit-by-bit verification can be decreased to shorten the programming time.

According to the present invention, the threshold voltages of the memory cells are detected prior to erasing, and data are programmed in a fast erasable memory cell at a relatively low erase voltage and in a slow erasable memory cell at a relatively high erase voltage, thereby suppressing a variation in the erasing characteristics. Therefore, bit-by-bit verification can be omitted, or the repetition numbers of times of erasing and bit-by-bit verification can be decreased to shorten the erase time.

In addition, according to the present invention, pre-programming is performed after erasing with a voltage sufficiently lower than the programming voltage.

Pre-programming is performed for each unit of memory cells for erasure. This pre-programming increases the threshold voltage of a fast programmable memory cell. Threshold voltages are verified during pre-programming, and when the threshold voltage of any one of the memory cells reaches a predetermined value, the pre-programming is ended. In this manner, a fast programmable memory cell is programmed in pre-programming to set the initial value of the programming voltage high, thereby shortening the programming time.

Similarly, according to the present invention, pre-erasing is performed after programming with a voltage sufficiency lower than the erase voltage. This pre-erasing decreases the threshold voltage of a fast erasable memory cell. Threshold voltages are verified during pre-erasing, and when the threshold voltage of any of the memory cells reaches a predetermined value, the pre-erasing is ended. In this manner, a fast erasable memory cell is erased by pre-erasing to set the initial value of the erase voltage high, thereby shortening the erase time.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 5A is a view showing the waveform of the programming pulse for bit-by-bit verification programming in the present invention;

FIG. 5B is a view showing the change in threshold voltages during bit-by-bit verification programming;

FIG. 6 is a graph showing the change in threshold voltages during programming of memory cells according to the present invention;

FIG. 7 is a block diagram showing the entire arrangement of a NAND-cell type EEPROM according to the first embodiment;

FIG. 14 is a timing chart showing the operation timing of the circuit in FIG. 13;

FIG. 17 is a timing chart showing the operation timing of the circuit in FIG. 16;

FIG. 18A is a graph showing the pre-programming characteristics in the third embodiment;

FIG. 18B shows the pre-programming pulse used in the third embodiment;

FIG. 19A is a graph showing the programming characteristics during pre-programming in the third embodiment;

FIG. 19B is a graph showing the programming characteristics during pre-programming in the third embodiment;

FIG. 20 is a circuit diagram showing an equivalent circuit of a NOR cell section as a modification of the present invention; and FIG. 21 is a graph showing the distribution of threshold voltages of the NOR cell section after erasing or programming.

DETAILED DESCRIPTION OF THE PREFERRED EMBODIMENTS

Preferred embodiments of a nonvolatile semiconductor memory device according to the present invention will be described below with reference to the accompanying drawings.

[Basic Arrangement]

Prior to a description of the embodiments, the basic arrangement used when the present invention is applied to a NAND-cell type EEPROM will be described.

Figure 1A:
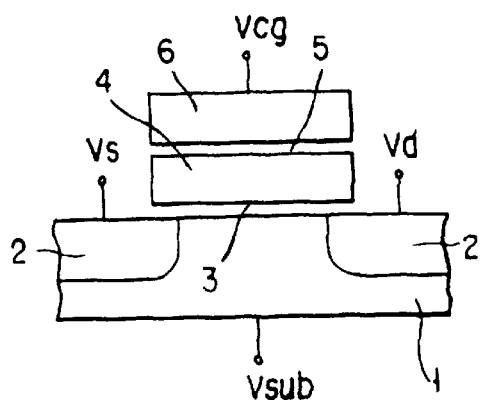
FIG. 1A shows a sectional structure of a memory cell of the present invention.

FIG. 1A is a schematic view showing the structure of a memory cell of an EEPROM according to the present invention. The memory cell comprises a floating gate (charge storage layer) 4 and a control gate 6 which are stacked on a P-type substrate (or P-type well region) 1, and N-type diffusion layers 2 serving as a source and a drain. A tunnel insulation film 3 is arranged between the P-type substrate (or P-type well region) 1 and the floating gate 4. A gate insulation film 5 is arranged between the floating gate 4 and the control gate 6.

Figure 1B:
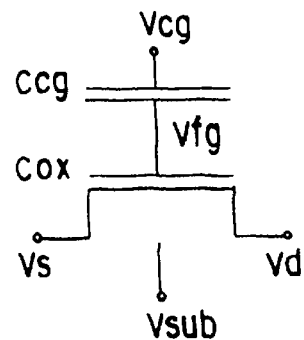
FIG. 1B is an equivalent circuit diagram of the memory cell of the present invention.

FIG. 1B is a circuit diagram of the equivalent circuit of the memory cell. Reference symbol Vcg denotes a control gate voltage; Vfg, a floating gate voltage; Vs, a source voltage; Vd, a drain voltage; Vsub, a P-type substrate (or P-type well region) voltage; Ccg, an electrostatic capacitance between the control gate 6 and the floating gate 4; and Cox, a capacitance between the floating gate 4 and a surface region of a semiconductor region which sandwich the tunnel insulating film 3 therebetween.

A threshold variation voltage pulse is applied to the control gate 6, the source, the drain, and the P-type substrate (or P-type well region) 1 so as to apply, to the tunnel insulating film 3, an electric field having a potential which becomes higher toward the floating gate 4. Electric charges of the P-type substrate (or P-type well region) 1 move to the floating gate 4 through the tunnel insulating film 3, and the threshold voltage changes toward the positive direction.

When a threshold variation voltage pulse is applied to the control gate 6, the source, the drain, and the P-type substrate (or P-type well region) 1 so as to apply, to the tunnel insulating film 3, an electric field having a potential which becomes lower toward the floating gate 4, electric charges of the floating gate 4 move to the P-type substrate (or P-type well region) 1 through the tunnel insulating film 3. In this case, the threshold voltage changes toward the negative direction.

Figure 2A:
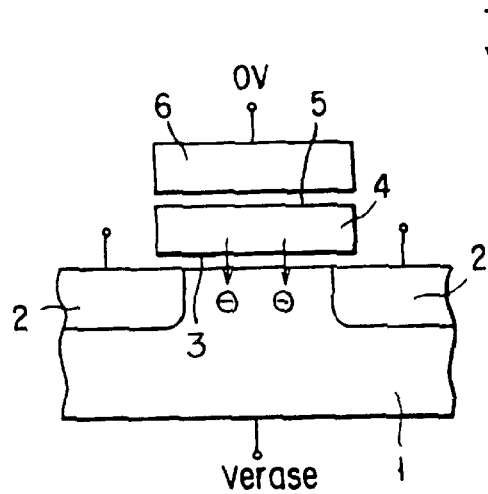
FIG. 2A is a sectional view showing the erasing principle of the memory cell of the present invention.

FIGS. 2A to 2D show the erasing and programming principles of the memory cell. As shown in FIG. 2A, erasing is performed using 0 V for the voltage Vcg of the control gate 6 and the P-type substrate voltage (or P-type well region voltage) Vsub as an erase voltage Verase (=about 20 V). The source voltage Vs and the drain voltage Vd may be set equal to the erase voltage Verase or may be set to a floating level as shown in FIG. 2A. Electrons are discharged from the floating gate 4 to the P-type substrate (or P-type well region) 1 by a tunnel current, and the floating gate 4 is charged in the positive direction to decrease the threshold voltage of the memory cell in the negative direction.

Figure 2B:
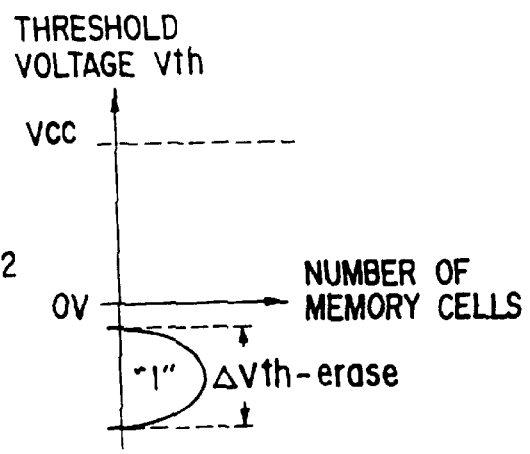
FIG. 2B is a graph showing the variation in threshold voltages after erasing.

In an EEPROM including many memory cells, the threshold voltages of the memory cells after erasing have a variation Δ Vth-erase due to process variations in memory cells, as shown in FIG. 2B. In this case, a threshold value after erasing is set at 0 V or less, which corresponds to data "1".

Figure 2C:
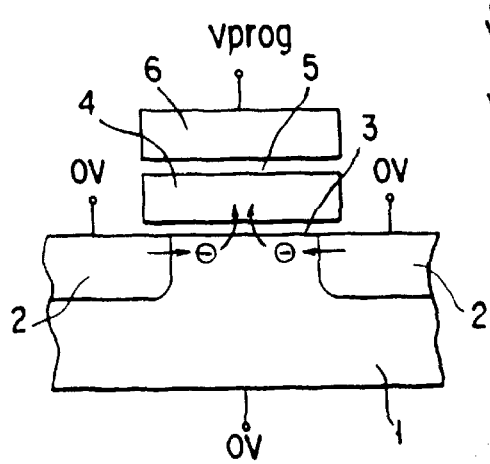
FIG. 2C is a sectional view showing the programming principle of the memory cell of the present invention.

As shown in FIG. 2C, "0" programming is performed using the voltage Vcg of the control gate 6 as a programming voltage Vprog (=about 20 V), the source voltage Vs of 0 V, the drain voltage Vd of 0 V, and the voltage Vsub of the P-type substrate (or P-type well region) 1 of 0 V. With this operation, electrons are injected into the floating gate 4 by a tunnel current, and the floating gate is charged in the negative direction to increase the threshold voltage of the memory cell toward the positive direction.

Figure 2D:
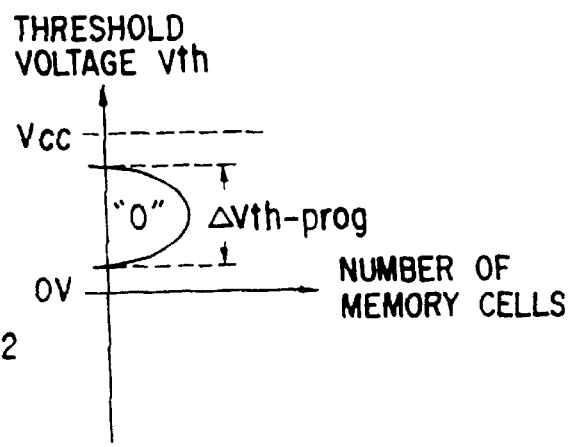
FIG. 2D is a graph showing the variation in threshold voltages after programming.

In the EEPROM including many memory cells, threshold voltages after programming have a variation Δ Vth-prog, as shown in FIG. 2D. In this case, a threshold voltage after "0" programming is set at 0 V or more. During "1" programming, the erased state is maintained. For this purpose, for example, each of the source voltage Vs and the drain voltage Vd is set to an intermediate voltage Vmb (=about 8 V) in FIG. 2C so as not to inject electrons into the floating gate 4. Programming means "0" programming hereinafter, unless otherwise specified.

FIGS. 3A to 3D show the voltage Vcg of the control gate 6, the voltage Vfg of the floating gate 4, the tunnel current Iprog flowing through the tunnel insulating film 3, and the threshold voltage Vth of the memory cell during programming, respectively.

Figure 3A:
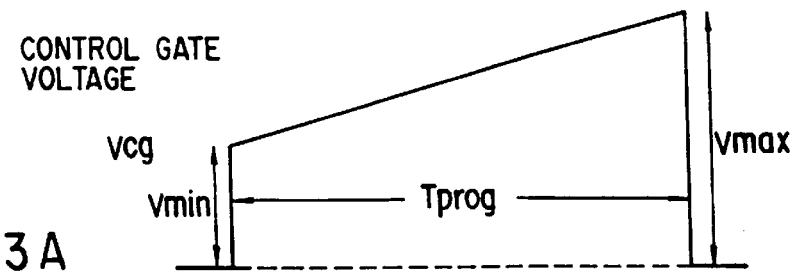
FIG. 3A is a view showing the control gate voltage during programming according to the present invention.
Figure 3B:
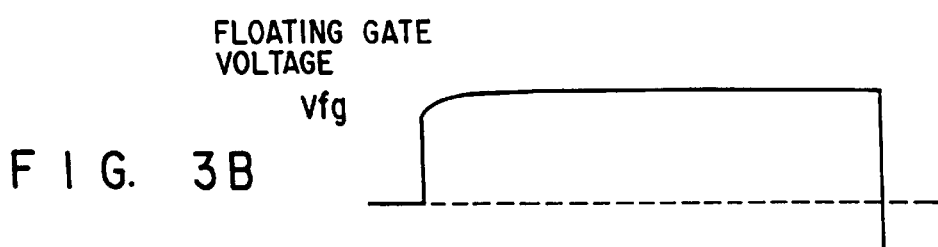
FIG. 3B is a view showing the floating gate voltage during programming according to the present invention.
Figure 3C:
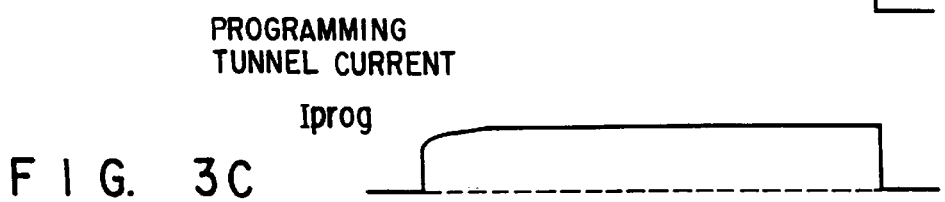
FIG. 3C is a view showing the tunnel current during programming according to the present invention.
Figure 3D:
FIG. 3D is a view showing the change in threshold voltages during programming according to the present invention.

To improve the reliability and shorten the programming time, the present invention employs a programming method in which programming is performed while the voltage Vfg of the floating gate 4 shown in FIG. 3B and the tunnel current Iprog flowing through the tunnel insulating film 3 shown in FIG. 3C are kept almost constant. To keep them constant, the programming voltage Vprog applied to the control gate 6 is gradually increased from Vmin to Vmax with the elapse of time, as shown in FIG. 3A, to gradually increase the threshold voltage Vth, as shown in FIG. 3D. During initial programming, the minimum programming voltage Vmin is applied, so that destruction of the tunnel portion caused by abrupt application of a high voltage can be prevented.

Figure 4:
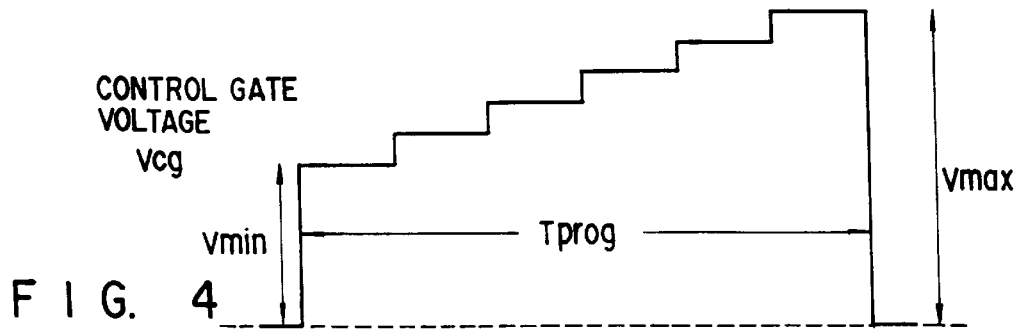
FIG. 4 is a view showing the waveform of the programming pulse according to the present invention.

The programming voltage Vprog is gradually increased in FIG. 3A. Alternatively, if it is increased stepwise as shown in FIG. 4, the same effect can be obtained.

As described above, the programming voltage Vprog is increased to suppress the electric field that is applied to the tunnel insulating film and perform electron injection at high speed. A decrease in potential of the floating gate due to electron injection for programming is canceled by increasing the programming voltage. With this operation, the floating gate voltage Vfg can be kept constant. An initial value Vmin of the programming voltage must be set to be sufficiently low so as to suppress the electric field applied to the tunnel insulating film during initial programming.

There is a bit-by-bit verification programming method for simultaneously programming data in a plurality of memory cells and further suppressing a variation in threshold voltages after programming, as shown in FIGS. 5A and 5B.

A programming voltage as shown in FIG. 3A is divided, and the divided voltages are intermittently applied as programming pulses, as shown in FIG. 5A. After application of each programming pulse, it is determined whether the threshold voltage of a memory cell has reached a verification potential. If the threshold voltage of a memory cell subjected to "0" programming reaches the verify potential, the voltage application state to the memory cell is changed from "0" programming to "1" programming. This can be easily realized by changing the source and drain voltages of the memory cell from 0 V to the intermediate voltage Vmb, as described above. The memory cell subjected to "1" programming is kept in the "1"-programmed state until the end of the programming.

With this bit-by-bit verification programming method, the threshold voltage of a memory cell is controlled as shown in FIG. 5B. In the most easily programmable cell, i.e., the fastest programmable cell, the threshold voltage exceeds the verify potential Vverify after application of the first programming pulse and the programming state is changed to the "1" programming state so that the threshold voltage does not change during application of the second and subsequent pulses. In a typical cell, a threshold voltage exceeds the verify potential Vverify during application of the third pulse. In the most difficult programmable cell, i.e., the slowest programmable cell, the threshold voltage exceeds the verify potential Vverify after application of the fifth pulse. In this manner, all cells subjected to "0" programming are set in the "1" programming state after application of the programming pulses with which their threshold voltages exceed the verify potential. Therefore, an effective programming time is adjusted for every bit to reduce the variation in threshold voltages after programming.

The width of the first pulse is set larger than that of the other pulses so as to sufficiently increase the threshold voltage of the fastest programmable cell. Therefore, the verification process can be omitted for the first programming pulse. This further realizes a decrease in programming time.

FIG. 6 shows the relationship between the threshold voltages of the memory cells and the effective programming time in more detail. Assume that the threshold voltage after erasing varies from −2 V to −5 V in this case. Programming is started from the fastest programmable cell. If the initial value Vmin of the programming pulse shown in FIG. 5A is decreased for this fastest programmable cell, and the increase rate of a programming voltage is constant, the programming time is prolonged due to the decrease in the initial value Vmin. In addition, the maximum value Vmax of the programming pulse is increased for the slowest programming cell to prolong the programming time, too.

To shorten the programming time, therefore, the threshold voltages after programming within the same programming time are matched. In the present invention, threshold voltages after programming within a predetermined time are matched by adjusting the programming voltages.

[First Embodiment]

The first embodiment of the present invention will be described below. In this embodiment, a programming voltage is optimized for every memory cell.

FIG. 7 shows the arrangement of a NAND-cell type EEPROM according to the first embodiment. A word line controller 102, a bit line controller 103, and a substrate (or cell well) controller 104 are provided to a memory cell array 101. The equivalent circuit of the memory cell array 101 is shown in FIG. 8 and formed on a P-type substrate or P-type well region.

The word line controller 102 selects a memory cell and controls a voltage Vcg of a control gate CG, a voltage Vsg of a selection gate SG, and a voltage $V_{SRC}$ of a source line SRC of the memory cell array 101 for erasing, programming, and threshold voltage detection of a memory cell. The bit line controller 103 controls a bit line voltage for controlling drain and source voltages of a selected memory cell during programming, and detects the threshold voltage of the selected memory cell through a bit line during threshold voltage detection. The substrate (or cell well) controller 104 controls the voltage of the P-type substrate or P-type well region having the memory cell array 101 formed thereon.

Figure 8:
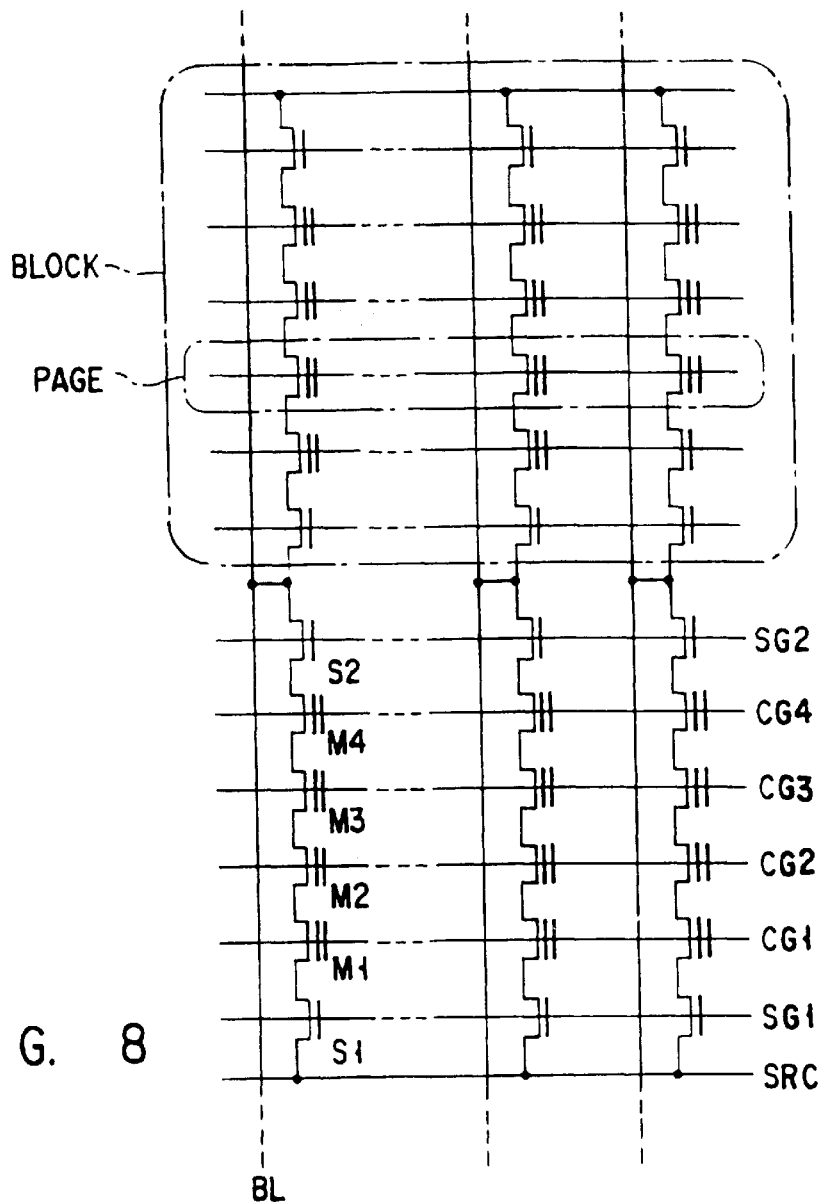
FIG. 8 is a circuit diagram showing an equivalent circuit of a NAND cell section used in the first embodiment.

FIG. 8 is a circuit diagram of the memory cell array according to the first embodiment. A NAND cell section comprises four memory cells M1 to M4 connected in series. One terminal of the NAND cell section is connected to the common source line SRC through a first selection transistor S1, and the other terminal is connected to a bit line BL through a second selection transistor S2. The cell array is divided into two blocks. One of NAND cell sections in one block and the corresponding one of NAND cell sections in the other block are commonly connected to one bit line through the second selection transistors S2. A page comprises cells having gates commonly connected in one block. That is, the control gates and the selection gates are shared by a plurality of NAND cells to constitute the memory cell array. Generally, erasing is performed in units of blocks, and programming is performed in units of pages.

Figure 9:
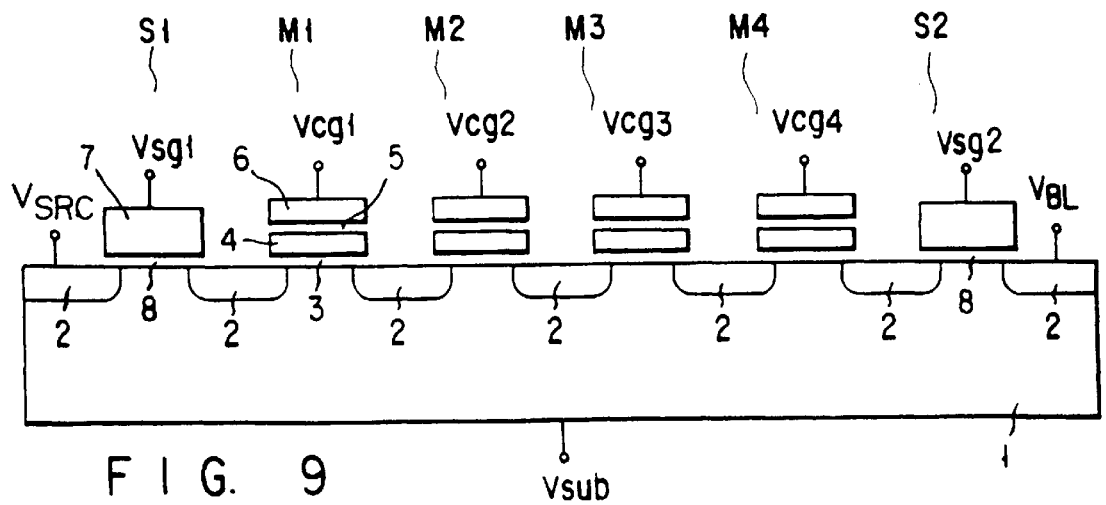
FIG. 9 is a sectional view showing the structure of a NAND cell section according to the first embodiment.

FIG. 9 shows the arrangement of the NAND cell section according to the first embodiment. The memory cells M1 to M4 are connected in series with each other and to the source line and the bit line through the selection transistors S1 and S2. As shown in FIG. 9, during each operation (reading, programming, erasing, or the like), the voltage $V_{SRC}$ and a voltage $V_{BL}$ are applied to the source line and the bit line, respectively. Voltages Vcgi (i=1 to 4) and voltages Vsg1 and Vsg2 are applied to the control gates of the memory cells M1 to M4 and the selection gates of the selection transistors S1 and S2, respectively. A memory cell M comprises a floating gate 4 and a control gate 6 stacked on a P-type substrate 1, and N-type diffusion layers 2 serving as a source and a drain. The P-type substrate 1 is insulated from the floating gate 4 by a tunnel insulating film 3. The floating gate 4 is insulated from the control gate 6 by an inter-gate insulating film 5. Note that a P-type well region may be used instead of the P-type substrate 1.

Each memory cell M is the same as in FIGS. 1A and 1B, and the programming and erasing principles are the same as shown in FIGS. 2A to 2D. Each selection transistor comprises a selection gate insulating film 8 and a selection gate 7 stacked on the P-type substrate (or P-type well region) 1, and the N-type diffusion layers 2 serving as a source and a drain. This is called a NAND cell block.

Data are simultaneously erased from the memory cells M1 to M4. An erase voltage Verase (=about 20 V) is applied as a substrate voltage Vsub, and the control gate voltages Vcgi (i=1 to 4) are set to 0 V. At this time, the erase voltage Verase may be applied to the bit line and the source line, or the bit line and the source line may be floating. The selection gate voltage is ideally set to the erase voltage Verase so as not to apply a voltage stress to the selection gate insulating film 8. The potential of the floating gate 4 after erasing is shifted to the positive direction due to a tunnel current flowing through the tunnel insulating film 3. Thus the threshold voltage of the memory cell is set negative, and the data in all the memory cells become "1".

Figure 10A:
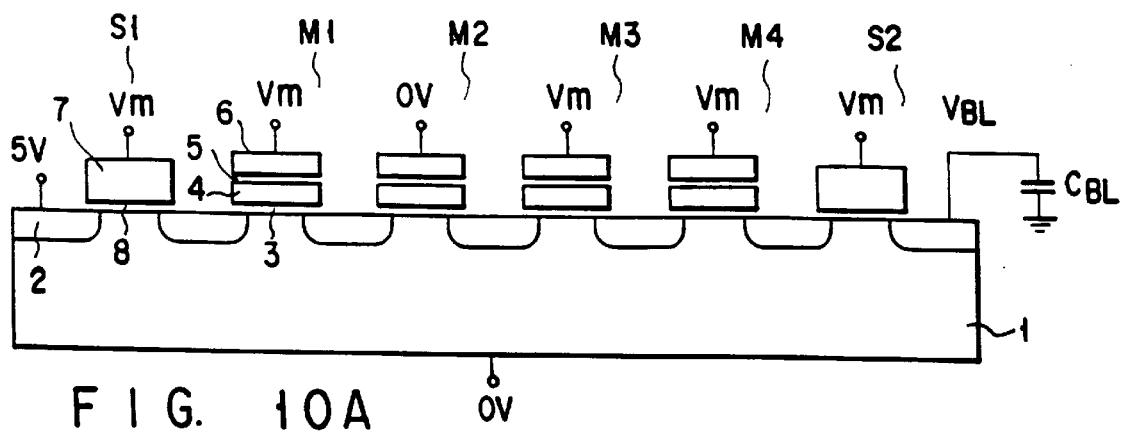
FIG. 10A is a sectional view for explaining the operation of examining the programmability of the memory cells in the first embodiment.
Figure 10B:
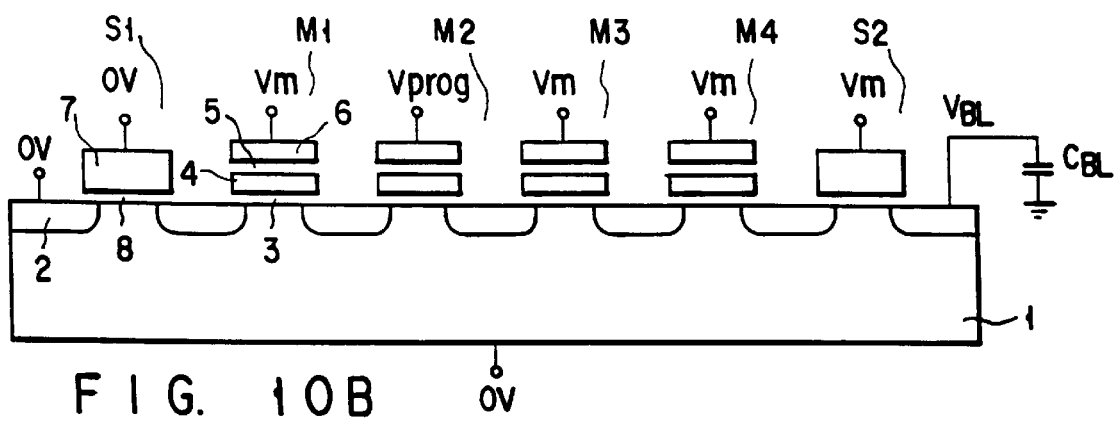
FIG. 10B is a sectional view showing programming with optimum programming voltages in the first embodiment.

FIGS. 10A and 10B show the operation principle of a programming method for optimizing the programming voltage. According to this method, variations in the threshold voltages of the memory cells after programming with the same period of time are reduced by programming data in an easily programmable (easily erasable) cell at a relatively low voltage and in a slow programmable (slow erasable) cell at a relatively high voltage. With this operation, the number of times of bit-by-bit verification described in FIGS. 5A and 5B is decreased (in some cases, the bit-by-bit verification can be omitted), thereby shortening the programming time.

FIG. 10A shows the operation of examining the programmability (erasability) of a memory cell. Assume that the second cell M2 from the source line is selected. This operation is performed after erasing. Assume that the source line voltage $V_{SRC}$ is 5 V, the control gate voltage Vcg2 of the selected memory cell M2 is 0 V, and the remaining control gate voltages and the selection gate voltages are the intermediate voltage Vm (=about 8 V). After the bit line is reset to 0 V, it is set to a floating level. The bit line set to a floating level is charged in accordance with the threshold voltage of the selected memory cell.

Figure 11:
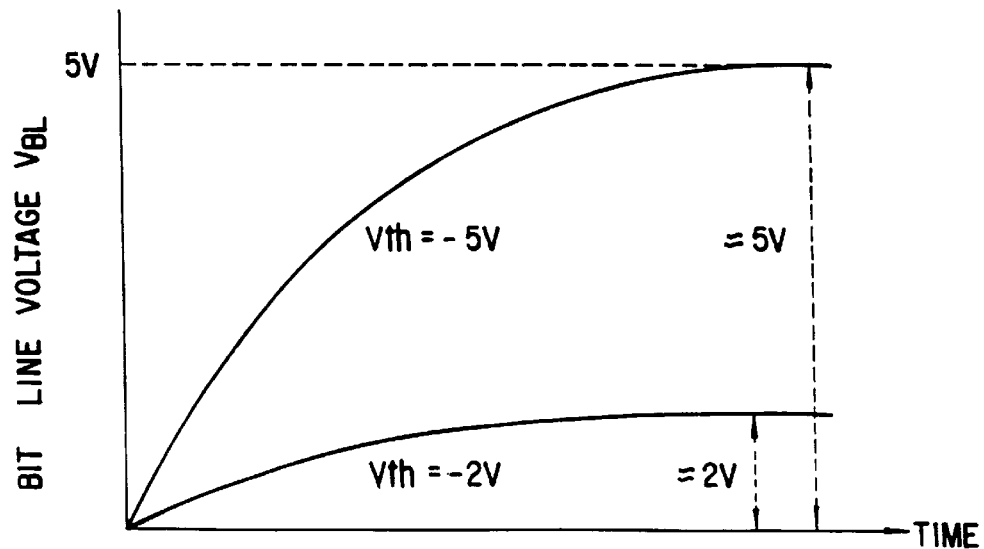
FIG. 11 is a graph showing the operation of generating the optimum programming voltages in the first embodiment.
Figure 12:
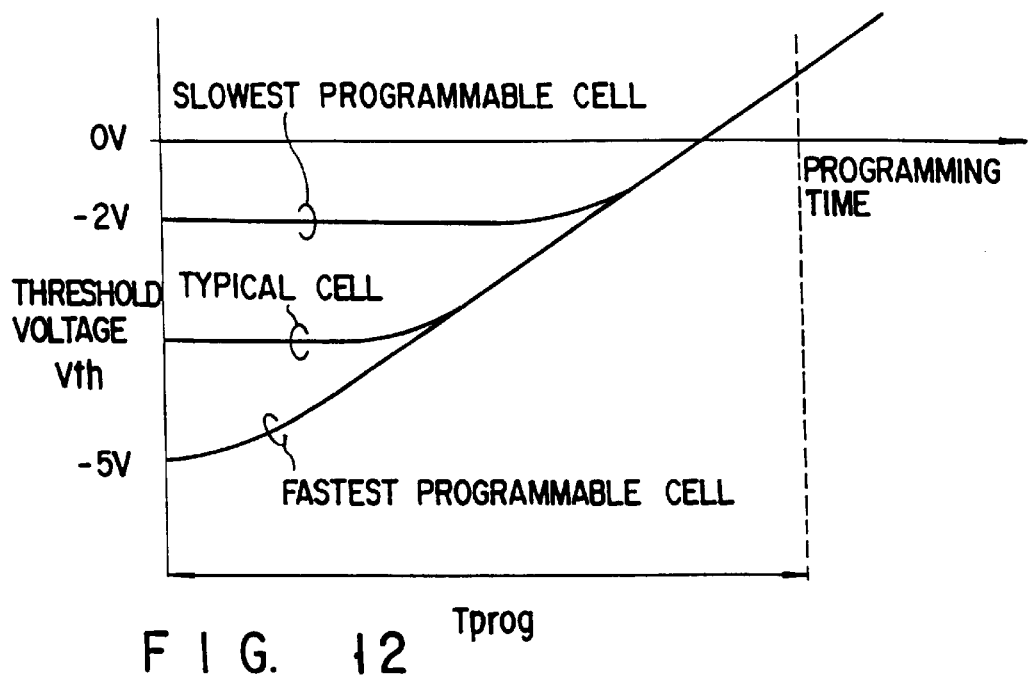
FIG. 12 is a graph showing the programming characteristics using the optimum programming voltages in the first embodiment.

As shown in FIG. 11, if the threshold voltage of the selected memory cell is −5 V, the bit line is charged to 5 V; and if the threshold voltage is −2 V, the bit line is charged only to 2 V. When the control gate voltage of the selected memory cell is set to −2 V, the bit line is charged to 3 V with the threshold voltage of −5 V or only to 0 V with the threshold voltage of −2 V.

Programming is performed using this bit line voltage, as shown in FIG. 10B. The control gate voltage Vcg2 of the selected memory cell M2 is set to a voltage Vprog (=about 20 V), and the remaining control gates voltages are set to the voltage Vm (=about 10 V). The selection gate voltage Vsg1 on the source side is set to 0 V, and the selection gate voltage Vsg2 on the bit line side is set to the intermediate voltage Vm. With this operation, data are programmed in a fast programmable cell at an effectively relatively low voltage and in a slow programmable cell at an effectively relatively high voltage. Therefore, variations in the threshold voltages after programming can be reduced.

Figure 13:
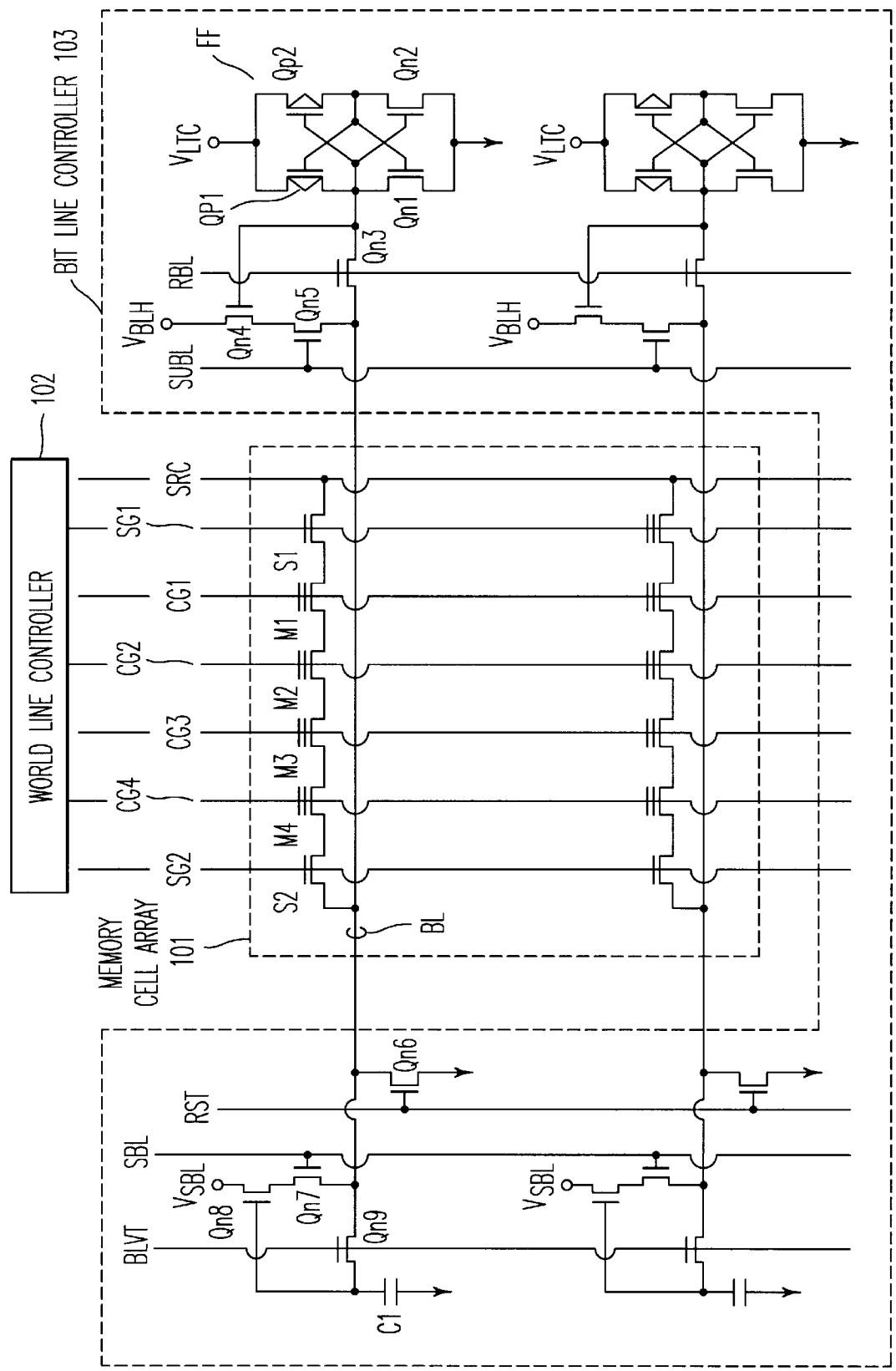
FIG. 13 is a circuit diagram showing an arrangement of a circuit of FIG. 7, except for substrate controller.

FIG. 13 is a circuit diagram showing the circuit of FIG. 7, except for the substrate controller 104.

A CMOS flip-flop comprised of P-channel MOS transistors Qp1 and Qp2 and N-channel MOS transistors Qn1 and Qn2 is a data latch circuit for storing programming data. During "0" programming, data is latched to set the gate of the N-channel MOS transistor Qn4 to "L". During "1" programming, data is latched to set the gate of the N-channel MOS transistor Qn4 to "H". Only during the "1" programming, a signal SUBL becomes "H" to transfer the voltage $V_{BLH}$ to the bit line.

The memory cells M1 to M4 and the selection transistors S1 and S2 constitute one NAND cell section, and a plurality of NAND cell sections share selection gates SG1 and SG2 and control gates CG1 to CG4.

When a reset signal RST goes to "H", the bit line BL is reset to 0 V by the N-channel MOS transistor Qn6. When the signal BLVT goes to "H" by the N-channel MOS transistor Qn9, the bit line voltage is stored in the capacitor C1. When the signal SBL goes to "H" in accordance with the voltage stored in the capacitor C1, the bit line is charged by N-channel MOS transistors Qn7 and Qn8.

An operation in the case when memory cells sharing the control gate CG2 are selected will be described with reference to FIG. 14. After erasing, the signal BLVT goes to "H", and the bit line BL is connected to the capacitor C1. The signal RST goes to "L", and the bit line BL is set to a floating level with respect to 0 V. A common source line voltage SRC is set to 5 V, and the selection gates SG1 and SG2 and the control gates CG1, CG3, and CG4 are set to the intermediate voltage Vm (=about 10 V). The selected control gate CG2 is set to 0 V. The voltage for charging the bit line BL is determined in accordance with the threshold voltage of the selected memory cell M2. After charging the bit line, the signal BLVT goes to "L", and the capacitor C1 stores the threshold voltage information of the memory cell M2. If the memory cell threshold voltage is −5 V, the capacitor C1 is set to 5 V; and if the threshold voltage is −2 V, the capacitor C1 is 2 V.

Programming is performed using the information stored in this capacitor C1 at an optimum programming voltage for each memory cell.

First, the signal RST goes to "L", and the bit line is set to a floating level. The signal SBL goes to "H", and the bit line is charged in accordance with the information stored in the capacitor C1. When the threshold voltage of the N-channel MOS transistor Qn8 is 0 V, if a voltage $V_{SBL}$ is set at 5 V or more, the bit line is charged to 5 V with the voltage of the capacitor C1 of 5 V, or the bit line is charged to 2 V with the voltage of the capacitor C1 of 2 V. When the threshold voltage of the N-channel MOS transistor Qn8 is 2 V, if the voltage $V_{SBL}$ is set at 3 V or more, the bit line is charged to 3 V with the voltage of the capacitor C1 of 5 V, or the bit line is set to 0 V with the voltage of the capacitor C1 of 2 V.

On the other hand, the signal SUBL and the voltage $V_{LTC}$ are set to the intermediate voltage Vm, and the voltage $V_{BLH}$ is set to the intermediate voltage Vmb. The intermediate voltage Vmb is transferred to the bit line through N-channel MOS transistors Qn4 and Qn5.

The selection gate SG1 is set to 0 V, the selection gate SG2 is set to the intermediate voltage Vm, the control gates CG1, CG3, and CG4 are set to the intermediate voltage Vm, and the control gate CG2 is set to the voltage Vprog. Programming is then performed.

The information stored in the capacitor C1 is basically held, provided that the signal BLVT is kept "L". Programming verification and programming are repeated to perform data programming.

As described above, according to this embodiment, the threshold voltages of the memory cells are detected after erasing, data are programmed in a fast programmable memory cell at a relatively low programming voltage and in a slow programmable memory cell at a relatively high programming voltage, thereby compensating for the variations in programming characteristics. Therefore, the repetition number of times of programming and bit-by-bit verification is decreased. In some cases, verification can even be omitted to greatly shorten the programming time.

This embodiment exemplifies the programming voltage optimization. Further, the erase voltage can be adjusted by inverting the polarity of the above programming voltage to cancel a variation in the cell erasing characteristics because a fast programmable cell also means that a cell is fast erasable. More specifically, the threshold voltages of the memory cells are detected after programming, data are erased from a fast erasable memory cell at a relatively low voltage and from a slow erasable cell at a relatively high voltage, thereby compensating for the variations in erasing characteristics. Therefore, the repetition number of times of erasing and bit-by-bit verification is decreased. In some cases, verification can even be omitted to greatly shorten the erase time.

[Second Embodiment]

Figure 15:
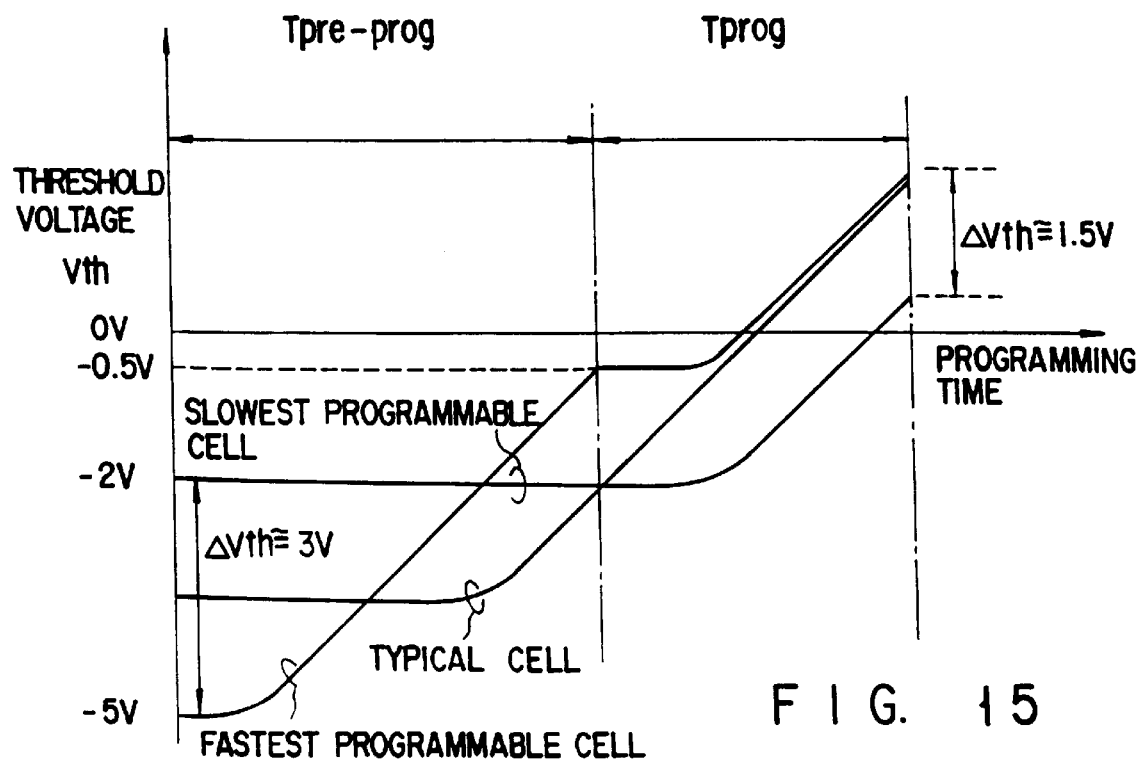
FIG. 15 is a graph showing the programming characteristics using the optimum programming voltages in the second embodiment.

The arrangement of a memory cell of the second embodiment is the same as in the first embodiment, and a detailed description thereof will be omitted. FIG. 15 shows the programming principle for explaining the second embodiment of the present invention.

After erasing, the first programming is performed for a time Tpre-prog, and the threshold voltages of the memory cells are examined. The programming voltage for a memory cell having a high threshold voltage, i.e., for a fast programmable memory cell, is reset to be lower (than that of remaining slow programmable memory cells) in the second programming Tprog.

In this embodiment, at the end of the first programming, the threshold voltage of the slowest programmable cell has not varied yet and is almost equal to the threshold voltage of a typical cell. For this reason, if only the second programming voltage for the memory cell having a high threshold voltage is reset to be relatively low, the programming speed of the slowest programmable cell is lower than for the other cells. In this embodiment, relatively the same programming voltages are used for memory cells having threshold voltages of –2 V or less after Tpre-prog even if the threshold voltages are different. Programming voltages only for memory cells having a threshold voltage of –2 V (=that of the slowest programmable memory cell) or more are optimized. In this embodiment, with the above operation, the distribution range of the threshold voltages after programming (after the second programming) becomes about 1.5 V, which is about half of about 3 V at the beginning of the programming (the beginning of the first programming Tpre-prog), thereby reducing the variations in the threshold voltages.

Figure 16:
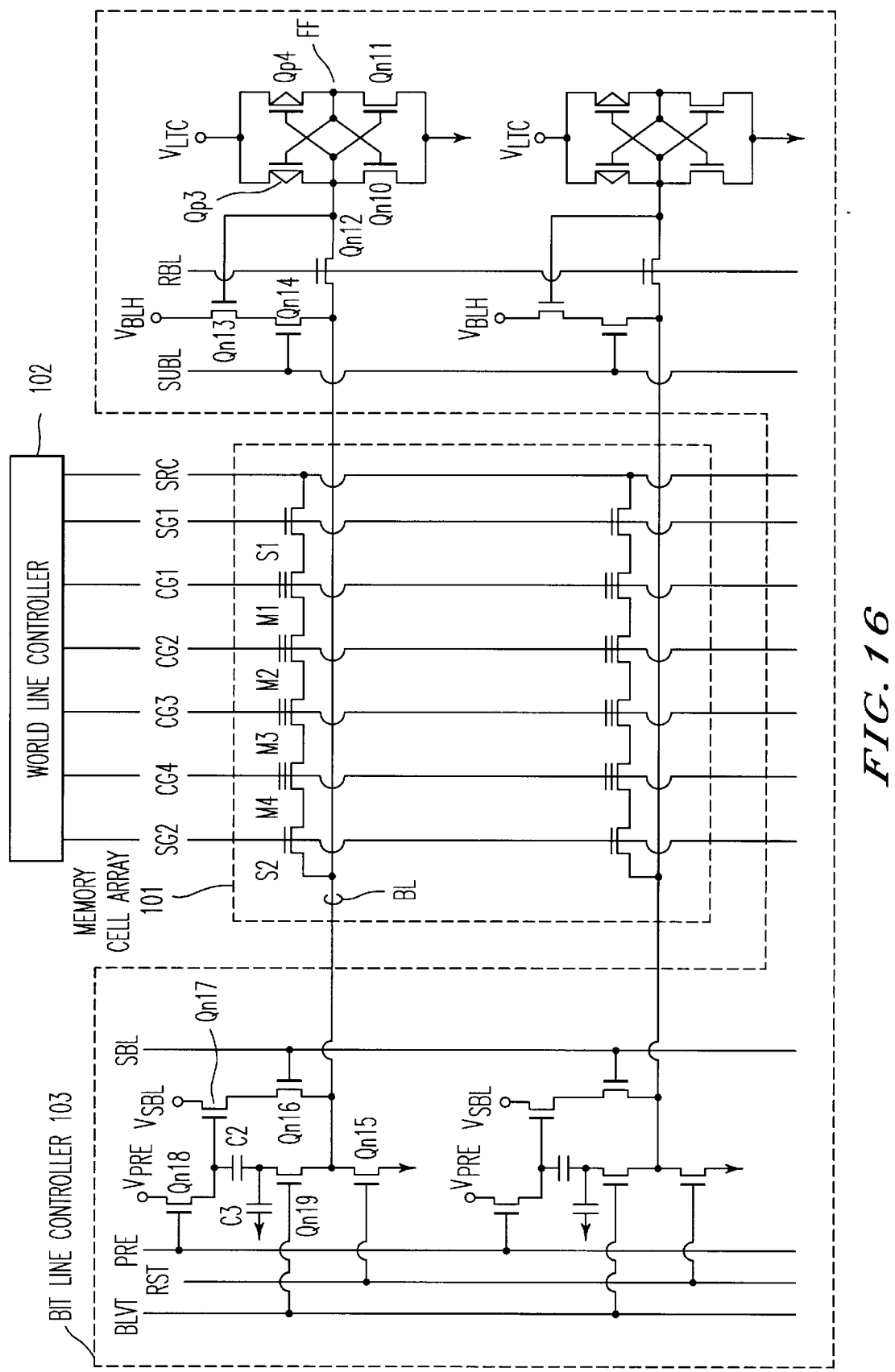
FIG. 16 shows a detailed circuit diagram of a second embodiment of an arrangement of the circuit of FIG. 7, except for substrate controller 104.

FIG. 16 is a circuit diagram for realizing the second embodiment of the circuit of FIG. 7, except for the substrate controller 104. A CMOS flip-flop comprised of P-channel MOS transistors Qp3 and Qp4 and N-channel MOS transistors Qn10 and Qn11 is a data latch circuit for storing programming data. During "0" programming, data is latched to set the gate of an N-channel MOS transistor Qn13 to "L". During "1" programming, data is latched to set the gate of the N-channel MOS transistor Qn13 to "H". Only during the "1" programming, a signal SUBL goes to "H", and a voltage $V_{BLH}$ is transferred to a bit line.

Memory cells M1 to M4 and selection transistors S1 and S2 constitute a NAND cell section, and a plurality of NAND cell sections share selection gates SG1 and SG2 and control gates CG1 to CG4.

When a reset signal RST goes to "H", a bit line BL is reset to 0 V by the N-channel MOS transistor Qn15. When a signal BLVT goes to "H" by the N-channel MOS transistor Qn19, the voltage of the bit line is stored in the capacitor C2. When a signal SBL goes to "H" in accordance with the voltage stored in the capacitor C2, the bit line is charged by N-channel MOS transistors Qn16 and Qn17. When a signal PRE goes to "H", an N-channel MOS transistor Qn18 resets the capacitor C2. A capacitor C3 stabilizes the information stored in the capacitor C2.

An operation in the case when memory cells share the control gate CG2 will be described with reference to FIG. 17. After erasing, the signal RST goes to "L", and the bit line is set to a floating level. A signal RBL and a voltage $V_{LTC}$ are set to intermediate voltages Vm and Vmb, respectively. The intermediate voltage Vmb and 0 V are transferred to a "1" programming bit line and a "0" programming bit line through the N-channel MOS transistor Qn12. The selection gate SG1 is set to 0 V, the selection gate SG2 is set to the intermediate voltage Vm, the control gates CG1, CG3, and CG4 are set to the intermediate voltage Vm, and the control gate CG2 is set to a voltage Vprog. The first programming is then performed.

Subsequently, the threshold voltage detection is started. It is possible to start the threshold voltage detection during the first programming. In either event, the threshold voltage at the end of the first programming is detected. The signal BLVT goes to "H", and the bit line BL is connected to the capacitor C2. The signal PRE goes to "H", and the capacitor C2 is reset. The signal RST goes to "L", and the bit line BL is set to a floating level with respect to 0 V.

A common source line SRC is set to 5 V, and the selection gates SG1 and SG2 and the control gates CG1, CG3, and CG4 are set to the intermediate voltage Vm (=about 10 V). The selected control gate CG2 is set to 0 V. The voltage for charging the bit line BL is determined in accordance with the threshold voltage of the selected memory cell M2. If the cell threshold voltage is –0.5 V, the bit line is charged to 0.5 V;

and if the threshold voltage is −2 V, the bit line is charged to 2 V. The selection gates and the control gates are reset to 0 V, and the signal PRE goes to "L". Then, the signal RST goes to "H", and the bit line is reset to 0 V. In the case of 2 V of a voltage $V_{PRE}$, when the bit line is reset to 0 V, the gate voltage of the N-channel MOS transistor Qn17 becomes 1.5 V with the memory cell threshold voltage of −0.5 V, or the gate voltage of the transistor Qn17 becomes 0 V with the threshold voltage of −2 V. The signal BLVT goes to "L", and the capacitor C2 stores the threshold voltage information of the memory cell.

The second programming is performed using the information stored in this capacitor C2 at an optimum programming voltage for each memory cell.

First, the signal RST goes to "L", and the bit line is set to a floating level. The signal SBL goes to "H", and the bit line is charged in accordance with the information stored in the capacitor C2. When the threshold voltage of the N-channel MOS transistor Qn17 is 0 V, if the voltage $V_{SBL}$ is set at 2 V or more, the bit line remains at 0 V with the gate voltage of the transistor Qn17 of 0 V, or the bit line is set to 1.5 V with the gate voltage of the transistor Qn17 of 1.5 V.

On the other hand, the signal SUBL and the voltage $V_{LTC}$ are set to the intermediate voltage Vm, and the voltage $V_{BLH}$ is set to the intermediate voltage Vmb. The intermediate voltage Vmb is transferred to the "1" programming bit line through the N-channel MOS transistors Qn13 and Qn14.

The selection gate SG1 is set to 0 V, the selection gate SG2 is set to the intermediate voltage Vm, the control gates CG1, CG3, and CG4 are set to the intermediate voltage Vm, and the control gate CG2 is set to the voltage Vprog. The second programming is then performed.

The information stored in the capacitor C2 is held, provided that the signals BLVT and PRE are kept "L". Programming verification and programming are repeated to perform data programming.

As described above, according to this embodiment, the first programming is performed for a predetermined time after erasing, and the threshold voltages of the memory cells are detected. Data are programmed in a fast programmable memory cell at a relatively low programming voltage and in a slow programmable memory cell at a relatively high programming voltage, thereby compensating for the variations in programming characteristics. Therefore, the repetition number of times of programming and bit-by-bit verification is decreased. In some cases, verification can be omitted to greatly shorten the programming time. Note that, in this case, the programming voltages for all cells are optimized after the first programming, the slow programmable cells are relatively decreased in speed.

In this embodiment, similar to the first embodiment, an erasing voltage can be adjusted by inverting the polarity of the above programming voltage to cancel a variation in cell erasing characteristics.

More specifically, the first erasing is performed for a predetermined time after programming, and the threshold voltages of the memory cells at that time are detected. Data are erased from a fast erasable memory cell at a relatively low voltage and from a slow erasable cell at a relatively high voltage, thereby compensating for the variations in erasing characteristics. Therefore, the number of times of repeating the erasing and bit-by-bit verification is decreased. In some cases, verification can be omitted to greatly shorten the erase time. Note that, in this case erasing voltages for all cells are optimized after the first erasing, the slow programmable cell is relatively decreased in speed.

Note that the first and second embodiments have exemplified the NAND cell section in which erasing/programming is performed with a tunnel current. The gist of the present invention is to reduce variations in memory cell threshold voltages after programming/erasing and to increase a programming/erasing speed by adjusting a programming/erasing voltage for each memory cell so as to cancel a variation in the programming/erasing characteristics of the memory cells. The variation in the programming/erasing characteristics can be detected by applying the same programming/erasing pulse to all memory cells to examine the threshold voltages after application of the pulse.

For this reason, the first and second embodiments are not limited to the devices of the type described above, but they can be executed for a device including P-channel memory cells and a device including NOR cells.

In addition, the same effect can also be obtained in a device in which erasing and programming are performed with a tunnel current between a drain or source and a floating gate or a device in which erasing and programming are performed with hot electrons or hot holes, in addition to a device in which erasing and programming are performed with a tunnel current through an entire channel surface.

[Third Embodiment]

The arrangement of a memory cell of the third embodiment is the same as in the first embodiment, and a detailed description thereof will be omitted. FIG. 18A is a graph showing programming characteristics of memory cells for explaining the programming principle of this embodiment. In this embodiment, a programming voltage is indirectly optimized by performing pre-programming after erasing to shorten the programming time.

Data are simultaneously erased from memory cells M1 to M4, as in the first embodiment. An erasing voltage Verase (=about 20 V) is applied as a substrate voltage Vsub, and control gate voltages Vcgi (i=1 to 4) are set to 0 V. At this time, the erasing voltage Verase may be applied to the bit line and the source line, or the bit line and the source line may be floating. The selection gate voltage is ideally set to the erasing voltage Verase so as not to apply a voltage stress to a selection gate insulating film 8. By erasing, the potential of the floating gate 4 is shifted to the positive direction due to a tunnel current flowing through the tunnel insulating film 3. The threshold voltage of the memory cell is set negative, and data in all the memory cells become "1".

The memory cells M1 to M4 are simultaneously pre-programmed, similar to erase. The control gate voltage Vcgi (i=1 to 4) serves as the pre-programming pulse voltage. As shown in FIG. 18B, it is ideal to set this pre-programming pulse voltage so as to increase with the elapse of time. With this setting, pre-programming can be performed at high speed while assuring the reliability of the memory cells. This pre-programming pulse voltage is set sufficiently lower than the programming voltage. The voltage increase rate of the pulse as shown in FIG. 18B is set sufficiently lower than that of the programming pulse. A bit line voltage and a source line voltage are set to 0 V. Selection gate voltages Vsg1 and Vsg2 are applied to transfer 0 V to the source and drain of a memory cell. For example, Vsg1=Vcc, and Vsg2=0 V. The P-type substrate voltage Vsub is 0 V.

With this pre-programming, the threshold voltage of a fast erasable memory cell, which has a large absolute value of a negative threshold voltage set by erasing, is set to a negative threshold voltage having a small absolute value. As shown in FIG. 18A, the most erasable memory cell is programmed as the fastest and the most difficultly erasable memory cell is programmed as the slowest. The pre-programming time is controlled to read the threshold voltage of a pre-programmed memory cell as data "1" during reading of the memory cell.

In FIG. 18A, the threshold voltage of the slowest erasable cell is set at −2 V during erasing. When the threshold voltage of any memory cell (this cell is the fastest programmable cell) exceeds the threshold voltage (−2 V in this Embodiment) of the slowest erasable cell, pre-programming is ended. To improve the controllability, popular threshold voltage verification is generally used with pre-programming because a change in a pre-programming pulse voltage changes a pre-programming time Tsoft. In this embodiment, the verification voltage Vverify of −1.5 V is used, and when the threshold voltage of the fastest programmable cell exceeds −1.5 V, pre-programming is ended. After pre-programming, the variation in threshold voltages is reduced.

FIG. 19A shows the programming characteristics of the memory cells after pre-programming using the programming pulse as shown in FIG. 3A or FIG. 5A.

During programming, a control gate voltage Vcgi of a selected memory cell is set as the programming voltage Vprog (=about 20 V), and a control gate voltage of other memory cells and a selection gate voltage Vsg2 of the selected memory cell are set to an intermediate voltage Vm (=about half the Vprog), and a selection gate voltage Vsg1 is set to 0 V. In "0" programming, a bit line voltage $V_{BL}$ is set to 0 V. In "1" programming, the bit line voltage $V_{BL}$ is set to an intermediate voltage Vmb (nearly equal to Vm). Note that, since data are programmed in a plurality of memory cells in a NAND-cell type EEPROM, it is preferable to employ a bit-by-bit verification scheme shown in FIGS. 5A and 5B during programming.

The variation in the threshold voltage of the memory cells at the start of programming is reduced in comparison with FIG. 6 because the threshold voltage of a fast programmable cell is increased by pre-programming. A dot-and-chain line in FIG. 19A represents the programming characteristics of the fastest programming cell without using pre-programming. Therefore, Vmin of a programming pulse as shown in FIG. 3A or FIG. 5A can be increased to perform programming at high speed, as shown in FIG. 19B. FIG. 19B is a graph using time t0 in FIG. 19A as time 0. Four cells are simultaneously pre-programmed in this embodiment, i.e., one block in the array shown in FIG. 8, thereby shortening the pre-programming time per memory cell. In a memory system using a background erasing scheme (scheme for performing erasing within the idle time when no read/write access is executed to one or more memory cells), the pre-programming time can also be hidden like the erasing time by performing pre-programming interlocked with erasing. In a memory system of another erasing scheme, pre-programming may be performed in the idle time after the erasing operation and before a programming operation.

The pre-programming pulse voltage during pre-programming is set sufficiently lower than Vmin of the programming pulse to suppress the degradation of the tunnel insulating film 3 caused by the strong electric field during programming.

Therefore, according to this embodiment, pre-programming is performed at a voltage sufficiently lower than the programming voltage, programming is advanced only for fast programmable memory cells, and the threshold voltage is verified. When the threshold voltage of the fastest programmable memory cell reaches a predetermined value, pre-programming is ended. With this operation, programming is advanced for fast programmable memory cells and the initial programming voltage can be set higher, thereby shortening the programming time. That is, an increase in the difference between the initial voltage and the final voltage in programming, and an increase in the number of times of programming verification, which are caused by a variation in the programming characteristics of the memory cells, can be suppressed to greatly shorten the programming time.

Note that, in the third embodiment, variations in the threshold voltages after erasing are compensated for by performing pre-programming to shorten the programming time. Alternatively, variations in the threshold voltages after programming may be compensated for by performing pre-erasing because the threshold voltages similarly vary after programming. That is, erasing may be advanced only for fast erasable memory cells by performing pre-erasing at a voltage sufficiently lower than the erasing voltage. Also in this case, threshold voltages are verified during pre-erasing, and when the threshold voltage of any memory cell reaches a predetermined value, the pre-erasing is ended. With this operation, erasing of the fast erasable memory cells can be advanced to shorten the erasing time.

Note that, as in the first and second embodiments, the third embodiment can be executed for a device including P-channel type memory cells and a device including NOR cells.

The same effect can also be obtained in, e.g., a device in which erasing and programming are performed with a tunnel current between a drain or source and a floating gate, and a device in which erasing and programming are performed with hot electrons or hot holes, in addition to a device in which erasing and programming are performed with a tunnel current through an entire channel surface.

A nonvolatile semiconductor memory device having a NOR memory cell array as a device having another structure will be described. FIG. 20 shows an equivalent circuit of the NOR-type memory cell array.

The case in which only memory cells M11 and M12 sharing a control gate CG1 are selected and other memory cells, such as memory cells M21 and M22 sharing a control gate CG2 and connected to source SRC2 are not selected, will be exemplified. The voltage of a source SRC1 of each selected memory cell and that of the control gate CG1 are respectively set to, e.g., 12 V and 0 V to perform erasing. Electric charges in the charge storage portions of the memory cells are injected to the source by erasing to decrease the threshold voltages. A decrease in the source voltage decreases the erasing speed. During programming, the selected control gate CG1 and the source SRC1 are set to, e.g., 12 V and 0 V, respectively. During "0" programming, a bit line BL is set to 7 V. During "0" programming, hot carriers are injected to the charge storage portions of the memory cells to increase the threshold voltages. A decrease in the bit line voltage decreases the programming speed. During "1" programming, the bit line is set to 0 V. During "1" programming, since no hot carrier is generated, the threshold voltages do not change.

FIG. 21 shows the distributions of the threshold voltages of plural number memory cell M11, M12 after erasing and programming of the NOR-type memory cells shown in FIG. 20 after passing (corresponding data "1") and programming (corresponding to data "0"). After erasing, each memory cell is in a "1" data state, and the threshold voltages fall within the range (e.g., 1 V to 3 V) of 0 V to a power supply voltage VCC (e.g., 5 V). After "0" programming, the threshold voltages are set to the power supply voltage VCC or more.

In order to detect the data programming speed, the threshold voltage after erasing is detected as in the first embodiment. The data erasing speed is high in the fast programming cell so that the threshold voltage after erasing in the fastest programming cell is set to 1 V. When the control gate CG1 and the source line SRC1 are applied with 3 V, and the bit line is applied with 0 V or floating, 2V appears or the bit line The threshold voltage after erasing in the slowest programming cell is set to 3V. Therefore, when the control gate CG1 and the source line SRC1 are applied with 3V and the bit line is applied with 0V or floated, 0 V appears on the bit line.

It is possible to equalize the data programming speed if the bit line voltage in data programming is lowered for the memory cell having the threshold voltage after erasing is low and if the bit line voltage in data programming becomes higher for the memory cell having the threshold voltage after erasing is high. In this manner, the same effect can also be obtained in the NOR-type memory cells as in the first embodiment.

The programming speed becomes faster if the bit line voltage becomes higher and is lowered if the bit line voltage is lowered. Therefore, it is possible to equalize the data programming speed. In this manner, the same effect can also be obtained in the NOR-type memory cells as in the second embodiment.

The same effect can also be obtained in the NOR-type memory cells as in the third embodiment if the preprogramming is performed after erasing in the fast programmable memory cell.

The present invention is not limited to the above embodiments, and various changes and modifications may be effected. For example, the first programming or first erasing for detecting threshold voltages in the second embodiment may be replaced with the pre-programming or pre-erasing in the third embodiment. Note that each of the above embodiments has exemplified a device formed in the p-well region, but the device may be directly formed on a P-type substrate.

What is claimed is:

1. A nonvolatile semiconductor memory device comprising:
    a plurality of electrically programmable memory cells each having a charge storage portion;
    means for detecting programmability of a selected memory cell of said plurality of memory cells; and
    programming means for applying a programming pulse to said selected memory cell, said programming pulse being dependent on the programmability of said selected memory cell detected by said detecting means.

2. A device according to claim 1, in which said detecting means detects the programmability by applying a selected voltage pulse to said selected memory cell and detecting a state of said selected memory cell to which said predetermined voltage pulse has been applied.

3. A device according to claim 2, which further comprises erasing means for applying a data erasing pulse to said selected memory cell, and in which said detecting means detects the state of said selected memory cell to which said data erasing pulse has been applied.

4. A device according to claim 2, which further comprises pre-programming means for applying a pre-programming pulse for pre-programming to said selected memory cell, and in which said detecting means detects the state of said selected memory cell to which said pre-programming pulse has been applied.

5. A device according to claim 1, in which said programming pulse has a voltage of a smaller absolute value if corresponding memory cell is an easily programmable cell and a voltage of a larger absolute value if corresponding memory cell is a difficultly programmable cell.

6. A nonvolatile semiconductor memory device comprising:
    a plurality of electrically programmable memory cells each having a charge storage portion;
    means for detecting programmability of at least two selected memory cells of said plurality of memory cells; and
    programming means for applying programming pulses to said at least two selected memory cells, said programming pulses being respectively dependent on the programmability of said at least two selected memory cells detected by said detecting means, so as to compensate a variation in programmability of said at least two selected memory cells.

7. A device according to claim 6, in which said detecting means detects the programmability of said at least two selected memory cells by simultaneously applying a predetermined voltage pulse to said at least two selected memory cells and detecting states of said at least two selected memory cells to which said predetermined voltage pulse has been applied.

8. A device according to claim 7, which further comprises erasing means for applying a data erasing pulse to said at least two selected memory cells, and in which said detecting means detects the states of said at least two selected memory cells to which said data erasing pulse has been applied.

9. A device according to claim 7, which further comprises pre-programming means for applying a pre-programming pulse for pre-programming to said at least two selected memory cells, and in which said detecting means detects the states of said at least two selected memory cells to which said pre-programming pulses has been applied.

10. A device according to claim 6 in which said programming pulse has a voltage of a smaller absolute value if corresponding memory cell is a fast programmable cell and a voltage of a larger absolute value if corresponding memory cell is a slow programmable cell.

11. A nonvolatile semiconductor memory device comprising:
    a plurality of electrically programmable memory cells each having a charge storage portion;
    means for detecting erasability of a selected memory cell of said plurality of memory cells; and
    erasing means for applying an erasing pulse to said selected memory cell, said erasing pulse being dependent on the erasability of said selected memory cell detected by said detecting means.

12. A device according to claim 11, in which said detecting means detects the erasability by applying a predetermined voltage pulse to said selected memory cell and detecting a state of said selected memory cell to which said predetermined voltage pulse has been applied.

13. A device according to claim 12, which further comprises programming means for applying a data programming pulse to said selected memory cell, and in which said detecting means detects the state of said selected memory cell to which said data programming pulse has been applied.

14. A device according to claim 12, which further comprises pre-erasing means for applying a pre-erasing pulse for pre-erasing to said selected memory cell, and in which said detecting means detects the state of said selected memory cell to which said pre-erasing pulse has been applied.

15. A device according to claim 11, in which said erasing pulse has a voltage of a smaller absolute value if corresponding memory cell is an easily programmable cell and a voltage of a larger absolute value if corresponding memory cell is a difficultly programmable cell.

16. A nonvolatile semiconductor memory device comprising:
    a plurality of electrically programmable memory cells each having a charge storage portion;

means for detecting erasability of at least two selected memory cells of said plurality of memory cells; and erasing means for applying erasing pulses to said at least two selected memory cells, said erasing pulses being respectively dependent on the erasability of said at least two selected memory cells detected by said detecting means, so as to compensate a variation in erasability of said at least two selected memory cells.

17. A device according to claim 16, in which said detecting means detects the erasability of said at least two selected memory cells by simultaneously applying a predetermined voltage pulse to said at least two selected memory cells and detecting states of said at least two selected memory cells to which said predetermined voltage pulse has been applied.

18. A device according to claim 17, which further comprises programming means for applying a data programming pulse to said at least two selected memory cells, and in which said detecting means detects the states of said at least two selected memory cells to which said programming pulse has been applied.

19. A device according to claim 17, which further comprises pre-erasing means for applying a pre-erasing pulse for pre-erasing to said at least two selected memory cells, and in which said detecting means detects the states of said at least two selected memory cells to which said pre-erasing pulse has been applied.

20. A device according to claim 16 in which said erasing pulse has a voltage of a smaller absolute value if corresponding memory cell is a fast programmable cell and a voltage of a larger absolute value if corresponding memory cell is a slow programmable cell.

21. A nonvolatile semiconductor memory device comprising:

a plurality of electrically programmable memory cells each having a charge storage portion;

erasing means for applying an erasing pulse to selected memory cells of said plurality of memory cells;

pre-programming means for applying a pre-programming pulse having a polarity reverse to a polarity of said erasing pulse to said selected memory cells in the erased state;

verification means for detecting a state of said selected memory cells to which said pre-programming pulse has been applied; and programming means for applying a programming pulse having the same polarity as the polarity of said pre-programming pulse to said selected memory cells, whereby application of said pre-programming pulse to said selected memory cells is continued until said verification means detects a predetermined state of said selected memory cells after pre-programming by said pre-programming means.

22. A device according to claim 21, in which said application of said pre-programming pulse to said selected memory cells is continued until said verification means detects that a threshold voltage of any one of said selected memory cells reaches a predetermined value.

23. A nonvolatile semiconductor memory device comprising:

a plurality of electrically programmable memory cells each having a charge storage portion;

programming means for applying a programming pulse to selected memory cells of said plurality of memory cells;

pre-erasing means for applying a pre-erasing pulse having a polarity reverse to a polarity of said programming pulse to said selected memory cells in a programmed state;

verification means for detecting a state of said selected memory cells to which said pre-erasing pulse has been applied; and erasing means for applying an erasing pulse having the same polarity as the polarity of said pre-erasing pulse to said selected memory cells, whereby application of said pre-erasing pulse to said selected memory cells is continued until said verification means detects a predetermined state of said selected memory cells after pre-erasing by said pre-erasing means.

24. A device according to claim 23, in which said application of said pre-erasing pulse to said selected memory cells is continued until said verification means detects that a threshold voltage of any one of said selected memory cells reaches a selected value.

25. A nonvolatile semiconductor memory device comprising:

a plurality of electrically programmable memory cells;

means for detecting a threshold voltage of a selected memory cell of said plurality of memory cells of which data has been erased; and means for programming the selected memory cell with a programming bias which is dependent on the threshold voltage of said selected memory cell detected by said detecting means.

26. A device according to claim 25, in which said programming bias is a lower voltage if the threshold voltage of the corresponding memory cell has a lower value and a higher voltage if the threshold voltage of the corresponding memory cell has a higher value.

27. A device according to claim 25, in which said detecting means comprising means for setting a bit line connected to the selected memory cell to a reset state and then a floating state so that the bit line is charged to a voltage corresponding to the threshold voltage of the memory cell, and means for detecting the voltage of the bit line.

28. A device according to claim 25, in which said programming means comprises means for applying a predetermined voltage to a word line and a voltage depending on the threshold voltage of said selected memory cell detected by said detecting means to a bit line.

29. A nonvolatile semiconductor memory device comprising:

a plurality of electrically programmable memory cells;

means for detecting a threshold voltage of a selected memory cell of said plurality of memory cells of which data has been programmed; and means for erasing the selected memory cell with an erasing bias which is dependent on the threshold voltage of said selected memory cell detected by said detecting means.

30. A device according to claim 29, in which said erasing bias is a lower voltage if the threshold voltage of the corresponding memory cell has a higher value and a higher voltage if the threshold voltage of the corresponding memory cell has a lower value.

31. A device according to claim 29, in which said detecting means comprising means for setting a bit line connected to the selected memory cell to a reset state and then a floating state so that the bit line is charged to a voltage corresponding to the threshold voltage of the memory cell, and means for detecting the voltage of the bit line.

32. A nonvolatile semiconductor memory device comprising:

a plurality of electrically programmable memory cells;

means for pre-programming a selected memory cell of said plurality of memory cells of which data has been erased with a pre-programming bias in a predetermined period of time;

means for detecting a threshold voltage of the selected memory cell which has been pre-programmed; and means for programming the selected memory cell with a programming bias which is dependent on the threshold voltage of said selected memory cell detected by said detecting means.

33. A device according to claim 32, in which said programming bias is a lower voltage if the threshold voltage of the corresponding memory cell has a higher value and a higher voltage if the threshold voltage of the corresponding memory cell has a lower value.

34. A device according to claim 32, in which said detecting means comprising means for setting a bit line connected to the selected memory cell to a reset state and then a floating state so that the bit line is charged to a voltage corresponding to the threshold voltage of the memory cell, and means for detecting the voltage of the bit line.

35. A device according to claim 32, in which said programming means comprises means for applying a predetermined voltage to a word line and a voltage depending on the threshold voltage of said selected memory cell detected by said detecting means to a bit line.

36. A nonvolatile semiconductor memory device comprising:

a plurality of electrically programmable memory cells;

means for pre-erasing a selected memory cell of said plurality of memory cells of which data has been programmed with a pre-erasing bias in a predetermined period of time;

means for detecting a threshold voltage of the selected memory cell which has been pre-erased; and means for erasing the selected memory cell with an erasing bias which is dependent on the threshold voltage of said selected memory cell detected by said detecting means.

37. A device according to claim 36, in which said erasing bias is a lower voltage if the threshold voltage of the corresponding memory cell has a lower value and higher voltage if the threshold voltage of the corresponding memory cell has a higher value.

38. A device according to claim 36, in which said detecting means comprising means for setting a bit line connected to the selected memory cell to a reset state and then a floating state so that the bit line is charged to a voltage corresponding to the threshold voltage of the memory cell, and means for detecting the voltage of the bit line.

39. A nonvolatile semiconductor memory device comprising:

a plurality of electrically programmable memory cells;

means for pre-programming selected memory cells which have been erased using a pre-programming bias;

means for detecting that threshold voltages of said selected memory cells reach a predetermined voltage; and means for programming said selected memory cells using a programming bias larger than the pre-programming bias after said detecting means detects that one of the threshold voltages of said selected memory cells reaches the predetermined voltage.

40. A device according to claim 39, in which said predetermined voltage has a level corresponding to the threshold voltage of a memory cell which is a slowest erasable cell which is most hardly erased.

41. A nonvolatile semiconductor memory device comprising:

a plurality of electrically programmable memory cells;

means for pre-erasing selected memory cells using a pre-erasing bias, which have been programmed;

means for detecting that threshold voltages of said selected memory cells reach a predetermined voltage; and means for erasing said selected memory cells using an erasing bias larger than the pre-erasing bias after said detecting means detects that one of the threshold voltages of said selected memory cells reaches the predetermined voltage.

42. A device according to claim 41, in which said predetermined voltage has a level corresponding to the threshold voltage of a memory cell which is a slowest programmable cell which is most hardly programmed.

* * * * *